(12) United States Patent
Rinne

(10) Patent No.: US 12,328,824 B2
(45) Date of Patent: Jun. 10, 2025

(54) METHOD AND DEVICE FOR DISASSEMBLING ELECTRONICS

(71) Applicant: 3R-Cycle Oy, Hyvinkää (FI)

(72) Inventor: Tero Rinne, Vaasa (FI)

(73) Assignee: 3R-Cycle Oy, Hyvinkää (FI)

( * ) Notice: Subject to any disclaimer, the term of this patent is extended or adjusted under 35 U.S.C. 154(b) by 541 days.

(21) Appl. No.: 17/634,001

(22) PCT Filed: Aug. 7, 2020

(86) PCT No.: PCT/FI2020/050523
§ 371 (c)(1),
(2) Date: Feb. 9, 2022

(87) PCT Pub. No.: WO2021/028618
PCT Pub. Date: Feb. 18, 2021

(65) Prior Publication Data
US 2022/0322592 A1   Oct. 6, 2022

(30) Foreign Application Priority Data

Aug. 12, 2019   (FI) .................................... 20195670

(51) Int. Cl.
*H05K 13/04* (2006.01)
*B09B 3/35* (2022.01)
*B09B 101/17* (2022.01)

(52) U.S. Cl.
CPC ........... *H05K 13/0486* (2013.01); *B09B 3/35* (2022.01); *B09B 2101/17* (2022.01); *Y10T 29/53274* (2015.01)

(58) Field of Classification Search
CPC . H05K 13/0486; H01L 24/98; B09B 2101/17; Y10T 29/53274; Y10T 29/49815
(Continued)

(56) References Cited

U.S. PATENT DOCUMENTS

| | | |
|---|---|---|
| 5,375,318 A | 12/1994 | Catalano |
| 8,807,189 B2* | 8/2014 | Meloni ............. H05K 13/0486 156/367 |
| 9,913,420 B2* | 3/2018 | Zhang ................ H05K 13/0486 |

FOREIGN PATENT DOCUMENTS

| | | |
|---|---|---|
| CN | 107886122 A | 4/2018 |
| CN | 207171143 U | 4/2018 |

(Continued)

OTHER PUBLICATIONS

International Search Report and Written Opinion mailed Dec. 23, 2020, from International Application No. PCT/FI2020/050523, 15 pages.

(Continued)

*Primary Examiner* — Thiem D Phan
(74) *Attorney, Agent, or Firm* — Meunier Carlin & Curfman LLC

(57) ABSTRACT

The present application provides a device for disassembling electronics, the device comprising transporting means (4) and/or holding means (5) arranged to receive one or more objects containing one or more electronic components, the holding means (5) being adjustable, imaging means (3) for imaging the object and/or measuring means for measuring the object, one or more removal means (6) for removing one or more electronic components from the object, the means being operatively connected to a control unit (1). The present application also provides a method for disassembling electronics with the device.

27 Claims, 5 Drawing Sheets

(58) Field of Classification Search
USPC .................. 29/762, 402.08, 407.1, 426.1
See application file for complete search history.

(56) References Cited

FOREIGN PATENT DOCUMENTS

| CN | 207655247 U | 7/2018 |
|---|---|---|
| CN | 109022795 A | 12/2018 |
| WO | 2013090517 A1 | 6/2013 |
| WO | 2018183337 A1 | 10/2018 |

OTHER PUBLICATIONS

Noll, R. et al., "Inverse Production Line for the Automated Dismantling of Mobile Phones with Selective Laser-based Detaching and Sorting of Valuable Components", Recycling und Rohstoffe, Band 11, Mar. 19, 2018, pp. 533-543.

Vongbunyong, S. et al., "General Plans for Removing Main Components in Cognitive Robotic Disassembly Automation", Proceedings of the 6th International Conference on Automation, Robotics and Applications, Feb. 17, 2015, pp. 501-506.

International Preliminary Report on Patentability, mailed Dec. 14, 2021, from International Application No. PCT/FI2020/050523, 10 pages.

Written Opinion of the International Preliminary Examining Authority, mailed Nov. 3, 2021, from International Application No. PCT/FI2020/050523, 10 pages.

Depopulating Motherboards for Gold Pins & IC Chips with an Air Hammer. YouTube [online] [video], Published Aug. 5, 2015, [https://www.youtube.com/watch?v=s6eOab7b6BE].

Alshibli, Mohammad et al., "A Decision Maker-Centered End-of-Life Product Recovery System for Robot Task Sequencing", Journal of Intelligent & Robotic Systems, Jul. 13, 2017, 14 pages.

Search report from the European Patent Office for corresponding application EP20851770.6. Dated on Aug. 4, 2023. 11 pages.

* cited by examiner

METHOD AND DEVICE FOR DISASSEMBLING ELECTRONICS

CROSS REFERENCE TO RELATED APPLICATIONS

This application is a United States National Phase Patent Application of International Patent Application Number PCT/FI2020/050523, filed on Aug. 7, 2020, which claims the benefit of priority to Finnish Application No. 20195670, filed on Aug. 12, 2019, the contents of which are incorporated by reference herein in their entireties.

TECHNICAL FIELD

The present application relates to methods and devices for disassembling electronics. More particularly the present application relates to method and devices which model the electronics and enable specifically removing and recovering one or more component(s) from the electronics.

BACKGROUND

Electronic waste, also called as e-waste or scrap electronics, refers to discarded electrical or electronical devices. Electronic waste contains electronic components, such as semiconductors, for example processors, other integrated circuits, transistors, chips, resistors, capacitors, LEDs, other diodes, wires, sensors and the like. Usually the components are installed on a circuit board by soldering.

As the electronic waste contains valuable metals and also harmful substances, it is important to recover these metals and other substances in a controlled and safe way. Known methods for recycling electronics usually include crushing the materials and recovering the metals from the crushed material by using very harsh methods, such as by melting the whole waste. This is however inefficient, energy-consuming and produces harmful gases, dust or other substances, which make the method unsafe and environmentally undesired.

Conventional methods for removing components from circuit boards include for example chemical method, methods based on heat and manual mechanical methods. Disadvantages of chemical methods include costs of the chemicals, soaking time, danger to the environment and to users, treatment of chemical waste, logistics of dangerous chemical and the like causing further cost.

An alternative method for removing components from circuit boards includes use of thermic energy and mechanical vibration, wherein the circuit boards are heated until the soldering tin is melted and the components may be vibrated off from the boards. Disadvantages of heat-based methods include exposing the materials of casings and circuit boards to high temperatures which causes formation of dangerous toxic gases and compositions, so these methods cannot be recommended to industrial use without efficient air cleaning systems.

Therefore there is a need to obtain methods for recycling electronic waste which methods help decreasing the use of such harmful and problematic conventional methods.

SUMMARY

It was found out how to enhance the pretreatment, disassembling and sorting of electronics waste so that less or no harmful recycling methods are required. The method is therefore environmentally safe. The methods and devices disclosed herein enable the handling and processing of a variety of different types, shapes and sizes of electronics, especially circuit boards.

In the present methods the treated electronics are analyzed before treatment to create an individual model of each piece of electronics, so that by using the information of the model the device can be adjusted separately for each piece of electronics, and the electronic components contained in each piece can be individually removed and recovered.

The present application provides a device for disassembling electronics, the device comprising
  transporting means, such as a conveyor, and/or holding means arranged to receive one or more object(s) comprising circuit board(s) containing one or more electronic component(s), the holding means being adjustable,
  imaging means for imaging the object and optionally measuring means for measuring the object, wherein the device comprises
  one or more removal means(s) for removing one or more electronic component(s) from the circuit board,
  optionally one or more recovery means for recovering removed electronic component(s),
  the means being operatively connected to a control unit, wherein the device is arranged
    to create a 3D model of the object, such as the circuit board, based on the information, preferably one or more image(s), obtained from the imaging means and optionally from the measuring means,
    to locate and optionally recognize one or more electronic component(s) from the model,
    to adjust the holding means, preferably by using the model, to adapt to the object and hold it,
    by using the 3D model to control the one or more removal means(s) to remove one or more electronic component(s) from the circuit board, and optionally
    to recover the removed electronic component(s) by using the recovery means.

The present application also provides method for disassembling electronics, the method comprising
  providing the device,
  providing one or more object(s) comprising circuit board(s) containing one or more electronic component(s), to the device,
  imaging the object to obtain one or more digital image(s) of the object and optionally measuring the object to obtain one or more dimension(s) of the object,
  creating a 3D model of the object, such as the circuit board, based on the information, preferably one or more image(s), obtained from the imaging and optionally from the measuring,
  locating one or more electronic component(s) from the model,
  adjusting the holding means, preferably by using the model, to adapt the holding means to the object and to hold it,
  by using the model controlling the one or more removal means to remove one or more electronic component(s) from the circuit board, and
  recovering the removed electronic component(s), optionally by using the recovery means.

The main embodiments are characterized in the independent claims. Various embodiments are disclosed in the dependent claims. The embodiments and examples presented in the claims and in the specification are mutually freely combinable unless otherwise explicitly stated.

By using the device and method disclosed herein it is possible to selectively remove and recover electronic components, which may be simply called as "components" herein, installed in or on a circuit board or other support, especially permanently installed components such as soldered components. Furthermore, the components can be removed and recovered without subjecting the whole object, such as the circuit board, to crushing, high temperatures, chemicals or the like conditions but the removal action can be subjected to a small area, especially directly to the component or to connectors thereof. Therefore no large heating elements are required, which saves energy and makes the device more safe. As the whole objects are not heated, such as would be the case if all the solderings in a circuit board would be melted at once, no harmful gases or fumes are released in large amounts, which further makes the device and method safe. If the whole circuit boards or the like objects would be heated, it would also damage the components which could release harmful chemicals from electrolyte capacitors or other components containing such substances. The heat could also damage the components in such way that they cannot be recovered in functional form. On the contrary in the present case when the removal operations are directed precisely to the connections of a component, it is possible to remove the component without damaging it and releasing large amounts of harmful gases or other substances.

As the objects to be treated are imaged and modelled, especially when a 3D model is created, it is possible to derive information enabling precise treatment of the objects. Properties of the components can be obtained from a database for recognized or identified components, so a suitable removal tool(s) and method(s) can be selected and used for each component. A database may contain information about the value and/or classification of a component, such as a resale value, content of valuable metal(s), content of harmful substance(s) and the like, so a decision can be made which component(s) to process, remove, and/or recover, and which not, and how and in which order, and how to place and/or further process the obtained component(s) and/or remaining parts of the objects.

Suitable parameters or other information relating to the usage of the tool, such as moving path, operating force, location and the like can be obtained, such as from a database or other saved data, and selected for a specific tool and/or for a specific component. This may be carried out substantially in real-time. The system may adapt to each object separately, and information obtained from removal actions of one object and/or one component may be used to teach the system to carry out further similar actions in an improved way, for example to use a more suitable tool, to use suitable energy, force, speed, amplitude, temperature or the like parameter or quantity. The system can the therefore implemented in an adaptive way, and improved treatment protocols, practices or instructions can be obtained and saved in a database.

When the components are classified and recovered accordingly already from the circuit boards, it is possible to obtain valuable metals in relatively small volume. Therefore the post-processing of the recyclable valuable materials is easier and more economical compared for example to a current situation wherein the circuit boards are simply crushed, and any recovery of metals is carried out from the crushed waste. With the present method radically less chemicals and processing equipment and time is required, which makes the recycling simple, economical and safe. It is also possible to recover components or other parts in practically undamaged or useful form.

BRIEF DESCRIPTION OF THE FIGURES

FIG. 3 shows examples of cutting tools.

DETAILED DESCRIPTION

Figure 1:
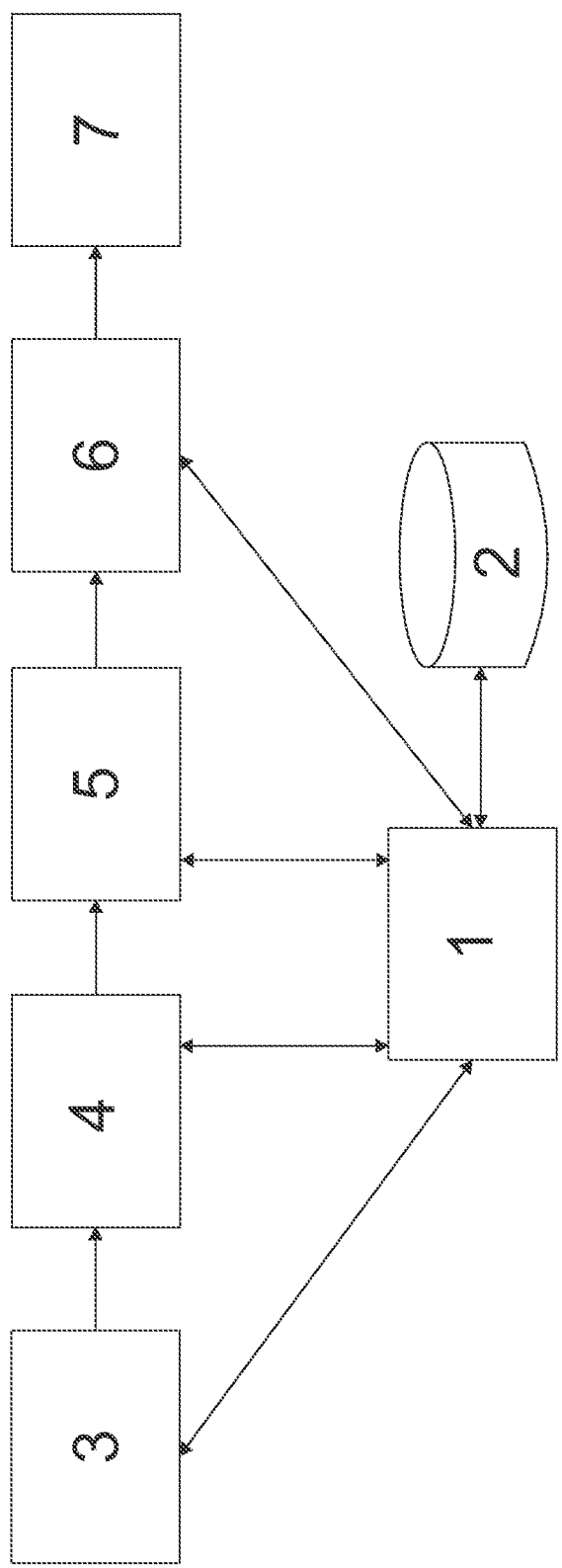
FIG. 1 shows a schematic example of a system for carrying out the present method

In this specification, if any numerical ranges are provided, the ranges include also the upper and lower values. The open term "comprise" also includes a closed term "consisting of" as one option.

In circular economy it is important to pretreat and sort waste material. Regarding electronics waste it is not enough to merely manually remove the cover parts and clearly harmful components, such as batteries, and finally crush the rest of the waste into smaller fractions and grind into desired particle size. If the previous principle only is used, all the recyclable materials would be finally present in the same fraction. This would make the sorting and recovery of the recyclable materials difficult and complex, especially in respect of such materials which are present only in certain components and/or in small amounts.

In the present method parts or pieces of the wastes, such as components, which are considered more valuable than others, can be detected, removed, recovered and sorted to that the further processing steps, such as ones using chemicals, heat, mechanical force and/or the like, can be directed to the essential fractions of the waste only. This lowers the need to use harmful chemicals and high temperatures, for example. Therefore environmentally safer and economical method is obtained. It is possible to recover valuable metals from separated components, such as gold, silver, platinum, rare earth metals and the like.

Some of the components may be desired to be recovered as second hand parts, for example valuable or rare integrated circuits, processors or other components. Such components can be removed and recovered from the electronics waste with preserving methods which do not harm or destroy the components. It is also possible to use block chain technology for selling or arranging aftermarket for the used components.

Valuable components may include semiconductors such as IC, MLCC, crystals, transistors and the like, and may contain valuable and/or rare metals. It is possible to selectively find, classify, remove and recover components such as processors, memory circuits, BGA, FPGA, EEPROM, logical circuits, transistors, crystals, resistors, capacitors of different classes, connectors, circuit boards and the like. After valuable components have been separated, the rest of the components and/or circuit boards can be further sold or recycled as low grade material, which may include copper, other base metals and glass fibre.

It is also possible to detect, removed and recover other metallic parts of the objects, such as coatings, for example gold, silver, copper and the like. The object is first imaged and modelled to define area(s) containing such metal, for example by analyzing colour, spectral analysis (XRF) of a reflection or by other suitable method, and then use a suitable removal tool for removing and recovering the metal(s). In such case the object may comprise also metal-coated scrap other than circuit boards, such as plates, cutlery, watches and the like. The method may comprise recognizing, removing and recovering one or more metal(s), which may be metal(s) present in the component(s), such as in one or more pin(s) or connector(s) of the component(s), or metal(s) present as a coating in the object, by using an electrochemical removal tool. Recognizing may comprise recognizing the type of metal, locating the metal, defining an area containing the metal and/or other suitable actions resulting in finding out the desired target to be recovered. The method may further comprise selecting a suitable removal tool and preferably operating parameters for it, and calculating a path for the tool. This may be carried out in the similar way as in the case of the component removal tools. The metal(s) may be recovered during the treatment of the object and/or in a further processing step, where the component has been already detached from the object and moved to another location.

Similarly, pieces or parts of the wastes which are considered as harmful or hazardous, such as electrolyte capacitors, can be selectively removed and recovered from the electronics waste so that the remaining waste is less harmful. Such treated electronics waste may be classified as more environmentally friendly and can be recycled or treated with less expenses and in simpler processes. The harmful components may be separately treated as harmful waste in a different process. Therefore the present method and device enables dividing the electronic components into one or more fractions and processing, such as recycling, each of the fractions separately. Further, also the circuit boards and the like supports can be separated and processed.

Currently the waste operators are bound by laws which regulate the treatment of electronics waste. For example according to some legislation all the circuit boards of certain size must be separately removed and disassembled, but still many waste operators simply feed the waste electronics to crushing devices as such, because there has not been reasonable equipment available for disassembling the waste electronics. The present system and method offers an inexpensive choice for waste operators so that the law can be obeyed.

The present application provides a device for disassembling electronics. The device may be arranged to carry out the method described herein. The device may contain any suitable combination of elements and features described herein, and it may be also considered as a device arrangement or a device setup, a system or a system setup. The device and system is described herein mostly by referring to handling and treatment of circuit boards but in practice any suitable object(s) or piece(s) of electronics or objects containing electronics, preferably electronics waste, which contains one or more recoverable component(s), may be used instead. The term "circuit board", as used herein, also called as "board", includes separate circuit boards, circuit boards installed in casings or supports, or containing other covers or extra parts, and parts of circuit boards. In general a circuit board suitable for the purposes of the present methods includes a support, such as a printed circuit board (PCB), which may comprise glass fibre, plastics, composite materials and/or other suitable support material, wherein one or more component(s) have been installed and which component(s) may be removed from the support. The circuit boards and the other suitable electronics waste pieces discussed herein and which are suitable for the present method may be also called as "waste electronics", "waste electronics pieces", "pieces", "items", "objects", "electronics objects" or "waste electronics objects", or by using an applicable combination of the terms. More particularly the general term "object" as used herein includes all applicable objects containing electronic components, which can be recovered by using the present methods and devices. The components may have been soldered or otherwise permanently installed into the support. In one example the present method is applied for removing soldered components from a circuit board. However also components not soldered or otherwise permanently attached, such as processors installed in a holder, may be recovered, for example by picking the component for example by using a suitable recovery tool. The object may be a circuit board, or the object may be an object containing or comprising a circuit board, such as a casing of the like. In the method the object may be disassembled to remove or open the casing or other cover to expose, to obtain and/or to separate a circuit board.

The present application provides a device for disassembling electronics, the device comprising
    transporting means and/or holding means arranged to receive one or more objects, such as circuit board(s), containing one or more electronic components, the holding means being adjustable,
    imaging means for imaging the object and/or measuring means for measuring the object,
    one or more removal means for removing one or more electronic component(s) from the object,
    optionally one or more recovery means for recovering removed electronic component(s),
    the means being operatively connected to a control unit arranged
        to create a model of the object based on the information obtained from the imaging means and/or from the measuring means,
        to locate and optionally recognize one or more electronic component(s) from the model,
        to adjust the holding means, preferably by using the model, to adapt to the object and hold it,
        by using the model to control the one or more removal means to remove one or more electronic component(s) from the object, and preferably
        to recover the removed electronic component(s) by using the recovery means.

The present application also provides a method for disassembling electronics, the method comprising
    providing the device of any of the preceding claims,
    providing one or more objects, such as circuit board(s), containing one or more electronic components, to the device,
    imaging the object to obtain one or more digital image(s) of the object and/or measuring the object to obtain one or more dimension(s) of the object,
    creating a model of the object based on the information, preferably one or more image(s), obtained from the imaging and/or from the measuring,
    locating one or more electronic component(s) from the model, adjusting the holding means, preferably by using the model, to adapt the holding means to the object and to hold it, by using the model controlling the one or more removal means to remove one or more electronic component(s) from the object, and recovering the removed electronic component(s), preferably by using the recovery means.

The device comprises transporting means and/or holding means arranged to receive one or more objects, such as circuit board(s), containing one or more electronic components, the holding means being adjustable. The transporting means and the holding means may be separate means or they may be combined, such as they may be present in a same ensemble or a part of the device. For example the transport means may comprise a conveyor, such as a conveyor belt, for example adjustable belt conveyor, or the like moving part arranged to receive the waste electronics, such as circuit boards. Other examples of transport means include conveyors such as screw conveyors, bull chain conveyors, and the like. The conveyor, or other transporting means, may contain one or more, such as two or more, separate units, such as modules and/or racks, for receiving separate objects. The transporting means may also comprise a moving arm or other suitable moving part, which may contain one or more grabbing or other holding means. In one embodiment the transporting means and/or the holding means comprise one or more robot arm(s). The transporting means and the holding means may be connected to one or more actuators for using the devices, preferably operatively controlled to one or more controlling units to control and use the actuators, the transporting means and/or the holding means. The transporting means may be arranged to transport the object to one or more directions, for example to one direction, which may be called processing direction, transport direction or a first direction, such as moving direction of a conveyor belt. The transporting and/or holding means may be arranged to turn the object, such as around one or more of x, y or z axis. The object may be turned for example to expose a desired side to the tools, such as to expose component side to the removal tool(s), to expose soldering side to removal tool(s), to adjust the angle of the object in a conveyor, and/or to carry out any suitable adjustment or movement.

The method may comprise, after adjusting the holding means to adapt the holding means to the object and to hold it, further adjusting the holding means to adjust the angle of the object, for example during conveying/moving/transportating and/or during modelling, during removing one or more components, and/or during any other method step. The angle may be adjusted in the conveyor and/or by a grabbing means, such as a robot arm, and the angle may be maintained for one or more further steps, such as during removing the one or more electronic component)s from the object, such as from a circuit board, and/or during recovering the removed electronic component(s). The angle of the object or circuit board may be adjusted such that the removed component(s) will be moved, preferably by gravity, for example conveyed and/or directed by at least partly on/by the surface of the object or circuit board, into a container, a funnel and/or other suitable collecting means provided below the object.

The device may also comprise feeding means such as a feeding device, for example a feeder or feeding unit. The feeding means may be used for feeding the objects to a conveyor or the like transporting means one by one, for example at a time point wherein the device is ready to receive a new object after a previous object has been processed or moved forward in the system.

The holding means comprises preferably adjustable holding means, such as one or more adjustable grabbing means or clamping means, and/or one or more adjustable element arranged to move in perpendicular direction to the transport direction of the object. Such and adjustable element may be installed or integrated to the transport means, such as a conveyor. For example a conveyor belt may be equipped with one or more, such as two, adjustable elements arranged to move in perpendicular direction to the transport direction of the conveyor belt. The objects may be therefore grabbed by the adjustable element(s) which press the objects at opposite sides or edges, and the object is held while it moves forward on the belt towards further processing steps. The transporting means and/or the holding means are preferably arranged to be adaptable to the received object. The adaptation may be obtained by using information detected from the object, such as by imaging and/or measuring, optionally using the model disclosed herein, and adjusting and/or controlling the transporting means and/or the holding means by using the information. Information may be detected from the object one or more times, such as continuously during the process. For example in case of changing situation, such as in the case of moving the object or during and/or after removal of component(s), it may be necessary to repeat the imaging to obtain information of the current situation. Therefore the imaging and/or modelling may be continuous or carried out continuously. In such way different sizes of object may be processed and the handling of the objects can be optimized. It is possible to collect information from removals of components, and to derive from this information suitable or optimal parameters for adjusting the transport means, holding means and/or removal means, and this information may be saved in a database and used for subsequent removal actions, so that the system may be adapted to remove and recover specific components. For example the system may recognize unsuccessful actions, such as too low or high holding, clamping or grabbing force, too high speed of a transport means or removal means, too low or high speed and/or force of a removal means, or the like action, which may have lead into breaking of the object or component or to an incomplete removal and/or recovery of a component. Based on the unsuccessful action(s) the system may be adapted to carry out improved subsequent corresponding actions. The system may create an adapted or adaptive model and/or protocol for carrying out one or more removal action(s).

A grabbing means may be a grab or a clamp, such as one installed to a moving arm, such as a robot arm or other robotized moving means. The grabbing means may be adjusted according to each board to individually grab the board in an optimal or an efficient way. The grabbing means may also comprise or be a vacuum grabbing means. Such means is connected to a source of vacuum, and the vacuum provided by the means may be controlled with a valve, which may be closed and opened, for example the valve is opened when vacuum is needed at the grabbing means to grab the object, and the valve is closed, and the vacuum in the grabbing means may further be released by opening another valve or the like means so that the object is released from the grabbing means. The grabbing means, or the valves and/or other actuators therein may be operatively connected to a control unit.

The device may be arranged to first receive the objects, such as circuit boards or casings containing a circuit board, which may be fed manually, automatically or as a combination thereof. An automatic feeding system 4 may be provided and used. The objects are received at the transporting means, and they may be stabilized by the holding means simultaneously or later. For example the holding mechanism may be located at a processing point 6, which contains a suitable holding means for holding and/or stabilizing the object during processing. The holding means may receive the object and adapt to the object to obtain a desired holding or grabbing effect. The adaptation of the holding means is controlled by the system, preferably individually to each object according to the detected properties of the object and by using a digital model created for the object.

The transporting means by contain one or more automated integrated holding and/or moving means, such as robotized means, which may be installed in a processing point or other suitable location. The transporting means and/or the holding means may also comprise one or more removal means, or these parts or functional devices may be separate.

For example the transporting means by contain one or more automated integrated rotation mechanism(s) which enable processing components installed on a desired side or both sides of the circuit board, for example mechanism(s) comprising one to more degree(s) of freedom robot(s) or robot arm(s). Alternative two or more robot actuator(s) of one to more degree(s) of freedom can be arranged to process components at both sides of a circuit board.

Examples of robots or robotized actuators include linear actuator(s), orthogonal robot(s), cylindrical robot(s), polar coordinate system robot(s), Scara robot(s), twisting joint robot(s), parallel robot(s), arm robot(s) and the like. Five types of mechanical joints for robots may be classified; these are linear joints, orthogonal joints, rotational joints, twisting joints, and revolving joints. An actuator of a robot cell may have one or more degrees of freedom. The device may contain means for separating a circuit board from a casing, cover or the like separate part, which preferably does not contain electronic components. Such means may comprise opening means configured to open the casing, the cover or the like separate part. The means for separating may be the same as used in other method steps, or they be specifically for this purpose. A circuit board may be separated from a casing by breaking or opening the casing, such as by using any suitable separating or opening means, such as mechanical cutting means disclosed herein, other cutting or melting means, or by using means for releasing any fastening means in the casing or the like, such as screws, bolts, nuts or the like. In some cases a cover of a casing may be removed, especially is case of plastic casing wherein the plastic can be easily broken by using a mechanical tool containing a blade, a cutter, a saw or any suitable sharp object and/or by applying suitable force by using a contacting tool. A circuit board exposed may be then further processed as discussed herein. An object containing other parts in addition to a circuit board, such as the casing or other covering or additional parts or elements, may be called as an object of a first stage. An object containing less such additional parts, such as an object wherein a casing has been removed or at least partly opened or break, for example a circuit board as such or an exposed circuit board, may be called as an object of a second stage. The method steps disclosed herein may be carried out for an object of a first stage, for an object of a second stage, or for both, if necessary.

The device may also comprise means for turning the object, such as a circuit board. This may be necessary for example in order to expose the side of the board comprising the components to the removal tools of the device. The means for turning may comprise one or more grabbers, which are arranged to grab the object, and to move and/or turn to change the orientation or position of the object. The holding means may be integrated with the means for turning the object, or the holding means may provide this functionality.

One or more other tools, such as means for removing one or more electronic component(s) from the object, such as the circuit board, also called as detaching means, detaching tools, removal tool(s) or removal means, may be integrated to the transport means, the holding means and/or to an actuator included therein. The removal tool may be removable and reconnectable tool or mechanism, or it may contain a removable and reconnectable tool part, such as a blade or the like, so that a suitable tool may be chosen and installed according to the need. Examples of such tools include water cutting tool, air hammer, air chipper, Guillotine cutter, ultrasound knife or cutter, laser or plasma cutting tool, soldering tool, infra red heater, restricted are heater element, pneumatic pressing and/or clamp tool, angle grinder, diamond wire cutting tool, or hybrids or combinations thereof, such as guillotine cutter attached to air hammer. Visual sensors or imaging means may be also integrated to the arms, platforms, actuators or other parts including the tools or other moving parts described herein.

In one embodiment the removal means comprises an actuator arranged to provide pulsed movement connected to a tool, such as a cutting tool, for example to a blade, a knife, a die, a hammer or other mechanical tool. The cutting tool may have a sharp edge for cutting. The actuator may be electric or pneumatic. Examples of such tools include air hammer and air chipper. The actuator is capable of providing suitable force, stroke, amplitude and actuating frequency to detach and/or remove the component(s). Such tools which provide pulses of mechanical energy were found especially suitable for processing soldered components from circuit boards. The circuit board preferably should not break during the removal, which could easily happen is too much mechanical force is applied. If the circuit board breaks, it may lead to interruption of the process or loss of the object, as it may not be possible to hold the broken board any more, and/or all the desired components may not be removed. By using a suitable tool directed to specifically hit the location wherein the component is attached to the circuit board, such as to a connector of the component, the used energy can be fully utilized to remove the component but not to cause significant pressure to the circuit board and to damage the circuit board in such extent that it would break. However, the used blade or other tool, the approach angle, the used force, pulsing force, frequency and/or amplitude and the like parameters shall be preferably adjusted and/or selected according to the type and size of the component and/or its connectors so that the tool causes a little as possible pressure or force to the support and/or as efficient breaking or cutting effect to the connectors as possible. This may be calculated by using the model of the object and component(s), and also information from databases and/or previous removal runs may be used to adapt the system to the current removal. This principle may be applied to the other removal tools as well.

The device may comprise one or more similar or identical removal means, for example cutting tools, such as two or more arranged as an array, for example in parallel. Each of these tools may be connected to a separate actuator and/or moving means, and each of them may be controlled independently. Such series or two or more removal means may be arranged in parallel perpendicularly to the direction of movement of the object, such as perpendicularly to the direction of movement of a conveyor. The array of such tools may be located above the received objects in the moving path of the objects, such as above a conveyor belt. The device may be arranged to detect one or more component(s) in an approaching object and move one or more of the tools in the array to contact the component(s) to detach the component(s). In such way the tools may be provided at the whole width of the object and only tool units needed to remove a desired component may be moved, such as lowered to the level of the support of the object, to detach the desired component. After this the used tools may be lifted back to the initial position. Such an arrangement is simple as it is not necessary to provide complex moving or controlling means for each tool in the array, but a simple means for moving the tool at one direction, such as vertical direction, may be enough. This may be arranged with a simple actuator. However, it is possible to provide a separate actuator arranged to provide pulsed movement connected to each tool in the array. In such case it is possible to provide individual operation of each tool, such as individual force, frequency and/or amplitude per stroke, so that a smaller detaching force and momentum can be used for a single tool operating at a relatively narrow width. An array of tools can process a relatively large area.

The device comprises imaging means to image the object, such as the circuit board. Imaging, as used herein is not be restricted to imaging by light, but other sources of energy may be used for imaging. Imaging results in one or more digital image(s) of the imaged target or object, such as the circuit board. The imaging means the object may be selected from one or more digital imaging means, such as optical imaging or magnetic imaging, radiating and/or acoustic imaging device(s) and systems including such devices. The methods and devices may include 3D scanning. 3D scanning is the process of analyzing a real-world object or environment to collect data on its shape and possibly its appearance. The collected data can then be used to construct digital 3D models. The image(s) obtained from imaging are used to construct a model. Imaging may be carried out at one or more time point(s), for example to get a number of imaging results, which may represent the object at different time points, such as after moving and/or treating the object. The imaging may be continuous imaging. The means or tools disclosed herein may be controlled and/or monitored by using information obtained from imaging. The object may be imaged and/or modelled at one or more directions, such as sides. The object may be imaged and/or modelled from the top when it enters the device and/or during advancing in the device. The object maybe imaged and modelled at two sides or more, such as at both sides of a board or a board-like object, for example at the soldering side and at the component side of a circuit board.

In one embodiment the imaging means the object is selected from one or more imaging, radiating and/or acoustic device(s), such as devices comprising one or more source(s) of light, radiation or sound, and one or more detector(s) of light, radiation or sound, for example one or more camera(s), laser scanner(s), Lidar(s), or Flash Lidar(s). The light may be visible light, infrared, near-infrared or UV, and also microwaves, X-rays, magnetic fields, such as MRI, or combinations thereof may be applied. For example a combination of visible and near-infrared (VNIR) and X-ray transmission (XRT) hyperspectral or multispectral imaging customised for a multi-sensor system may be used.

The device may contain one or more scanner(s) for scanning the inputted objects, which may be in different forms. The scanner may utilize light, radiation, sound or other applicable principles. Example of suitable scanning devices, principles and methods for use in scanning devices are disclosed in the present application. The scanner may be operatively connected to a control unit. Scanning may be carried out to obtain measured values such as profile, width, height (or thickness), depth (or length), edge, groove, bead, gap, angle, roundness, presence, flatness, deformation, flushness, spectral analysis, classification of materials and the like.

Methods and technologies which may be used for imaging include active and passive scanning. The difference of these options lies in principal in the source of radiation or other energy used for scanning. The passive scanners use usually radiation or energy of the environment, such as light, and the active scanners emit the radiation or other energy by themselves, i.e. they contain a source of radiation or other energy. A passive scanner may utilize one or two digital cameras. With one camera it is possible to obtain multiple images of the subject from different angles, and the images may be used to form a 3D image. This technology is based on photogrammetry, which is image-based modelling. By using the shades of light it is possible to define depth information of a surface. Stereographic technologies involving two cameras at a distance from each other, which shoot the same object and therefore obtain a vision including depth information, can be used. By analysing the same points of both images it is possible to define the distances of the points from a camera.

Active scanners include a source of radiation, such as laser diode (LED), a projector or a flash light; and one or more camera(s). Examples of active scanners include scanners based on time of travel of light (time-of-flight), scanners utilizing structured light, scanners utilizing white light, and conoscopic holography. Optical triangulation may be used in laser scanners and in scanners utilizing structured light.

The imaging means may comprise passive and/or active imaging means, such as passive and/or active scanner, for example passive and/or active optical scanner, passive and/or active scanner utilizing radiation including light, and/or passive and/or active scanner utilizing sound, or passive scanner utilizing other energy of the environment.

The imaging means may be movable, in which case it is connected to a moving means, which is operatively connected to the control unit. In an active imaging means the source of energy, for example a source of light, may be also movable, in which case it is connected to a moving means, which is operatively connected to the control unit. Such movable imaging means and/or movable source of energy can be moved to obtain an optimal imaging conditions, for example to reduce shadows and/or to obtain as complete image of the object or an element as possible, and/or at least two images from different angles and/or from different locations, which at least two images may be used to construct one image, a set of images, a modified image and/or a model, such as a 2D or 3D model.

A time-of-flight 3D laser scanner is an active scanner that uses laser light to probe the subject. At the heart of this type of scanner is a time-of-flight laser range finder. The laser range finder finds the distance of a surface by timing the round-trip time of a pulse of light. A laser is used to emit a pulse of light and the amount of time before the reflected light is seen by a detector is measured. Since the speed of light c is known, the round-trip time determines the travel distance of the light, which is twice the distance between the scanner and the surface.

A laser scanner based on triangulation send a laser dot or stripe to the surface of the subject, which is then reflected back to the sensor, such as CCD/PSD sensor, of the camera in the scanner. The information from the sensor may be saved in a memory card in the device or directly to a connected computer or control unit. With respect to time-of-flight 3D laser scanner the triangulation laser shines a laser on the subject and exploits a camera to look for the location of the laser dot. Depending on how far away the laser strikes a surface, the laser dot appears at different places in the camera's field of view. This technique is called triangulation because the laser dot, the camera and the laser emitter form a triangle. The length of one side of the triangle, the distance between the camera and the laser emitter is known. The angle of the laser emitter corner is also known. The angle of the camera corner can be determined by looking at the location of the laser dot in the camera's field of view. These three pieces of information fully determine the shape and size of the triangle and give the location of the laser dot corner of the triangle In most cases a laser stripe, instead of a single laser dot, is swept across the object to speed up the acquisition process.

The imaging device may be an optical imaging device, magnetic imaging device, acoustic imaging device or an imaging device using radiation. The imaging device may comprise one or more imaging devices and/or other devices for modelling the circuit board, such as a multi-sensor system or device. The imaging devices may comprise a source of light, magnetic field, sound or radiation and/or a receiver or detection means thereof.

Structured-light 3D scanners project a pattern of light on the subject and look at the deformation of the pattern on the subject. The pattern is projected onto the subject using either an LCD projector, sweeping laser or other stable light source. A camera, offset slightly from the pattern projector, looks at the shape of the pattern and calculates the distance of every point in the field of view.

The light may be modulated light, wherein the colour of the light changes constantly. In this way it is possible to avoid the interference caused by eternal light.

Scanners utilizing flashlight are also based on structured light. They send light pattern to the subject with the flash, and a camera records this pattern.

Laser scanning, also known as lidar, combines controlled steering of laser beams with a laser rangefinder. By taking a distance measurement at every direction the scanner rapidly captures the surface shape of objects. Construction of a full 3D model involves combining multiple surface models obtained from different viewing angles, or the admixing of other known constraints.

The optical imaging device may comprise one or more camera(s), laser scanner(s), Lidar device(s) ("Laser Imaging, Detection And Ranging"), flash Lidar device (s), optical sensor(s), and the like suitable devices or systems including such devices. The optical means, devices and methods may use visible light, infra red light, UV light, and/or microwaves for imaging.

Lidar is a surveying method that measures distance to a target by illuminating the target with pulsed laser light and measuring the reflected pulses with a sensor. Differences in laser return times and wavelengths can then be used to make digital 3D representations of the target. Lidar may be called 3D laser scanning, which is a special combination of a 3D scanning and laser scanning. The focal plane of a Flash lidar camera has rows and columns of pixels with ample "depth" and "intensity" to create 3D landscape models. Each pixel records the time it takes each laser pulse to hit the target and return to the sensor, as well as the depth, location, and reflective intensity of the object being contacted by the laser pulse. Flash uses a single light source that illuminates the field of view in a single pulse. Just like a camera that takes pictures of distance, instead of colors.

Hyperspectral imaging may be used to collect and process information from across the electromagnetic spectrum. It may be used for three dimensional imaging at infrared area, and a broadband supercontinuum laser may be utilized for imaging solid objects, for a point-form hyperspectral measurement and for imaging larger areas. The reflected multispectral light provides further information from the target. The supercontinuum light is a light with a very broad spectrum.

The magnetic imaging device may comprise for example magnetic resonance imaging device, such as a scanner and the like suitable devices or systems including such devices.

Devices using radiation may comprise for example roentgen device (X-ray) or other devices using ionizing or non-ionizing radiation and detection methods and devices thereof.

Examples of the imaging device and systems involve combination of visible and near-infrared (VNIR) and X-ray transmission (XRT) hyperspectral or multispectral imaging customised for a multi-sensor system.

Acoustic imaging devices may comprise one or more ultrasound imaging device(s) and the like suitable devices or systems including such devices. Ultrasound may be used for determining the dimensions of an object, the inner discontinuities thereof and certain properties of materials, such as elastic modulus. Ultrasound detection is based on an ultrasound directed to the object and the reflection of the sound from the object from different locations, such as inner discontinuity sites, back wall or the like. From the reflections it is possible to determine the location, size and type of a discontinuity in the object.

In the imaging an image is obtained, which may be a photographic image or an image derived from one or more photographs, or the image may be derived from other types of imaging, such as an image scanned by laser, sound, radiation or other suitable means disclosed herein. The image may be a first image, which is the original image obtained from imaging means, or it may be a second or further image, which is derived from one or more first image(s), for example by combining two or more images and/or by other image processing with suitable algorithm. Two or more images originally obtained from the same or from different imaging means may be combined by using suitable image processing algorithm. Also parts of the images or information from the images may be combined, such as depth information from one image may be combined with colour or other information from other image, or the depth information from one image may be combined with the other image. The images may include one or more photos, which may be from the same and/or from different angles or they may include other types of images obtained from other imaging means or methods, or a combination thereof. When combining images or information obtained from two or more imaging means, which may be different for example in respect of resolution, it may be necessary to carry out calibration, image resizing, focusing and/or other actions, which may be carried out using suitable software or algorithm. For example when using a RGB camera and a depth camera the resolution, i.e. the amount of pixels may be different in the different cameras, so it may be necessary to rescale or otherwise process one or more of the obtained images to align or scale the images together. The imaging may also include calibrating the imaging means, for example to calibrate the obtained image to actual dimensions so the dimensions of the elements, such as components, in the image may be accurately determined. The images may be preprocessed, such as by using conventional image processing methods including denoising, colour conversion, for example from colour into grayscale or into a different number of colours, cropping, combining, rescaling, resizing, geometric transformation, edge enhancing, contrast adjustment, lightness adjustment, gamma adjustment and/or with any other suitable filter or method. Pattern recognition, such as optical character recognition, may be carried out to define a pattern and/or text for an element, which may be further used to identify an element, such as a component. Pattern recognition may include using one or more of statistical methods, template matching, neural networks, deep learning, genetical algorithms, fuzzy logic and/or other suitable methods and algorithms.

The obtained image(s) may be matched, adapted or aligned into a generated coordinate reference system, which may be two dimensional or three-dimensional coordinate reference system, which coordinate reference system may be utilized to define the path(s) of the movable means, such as transporting means, grabbing means, removal means and/or recovery means. The coordinate reference system and/or the path(s) may be generated, defined and/or optimized by the system setup by using a suitable algorithm. The path may be determined to obtain a path optimized for one or more features selected from the path length, such as the shortest path from the location of the tool to the target, from operation speed and from avoiding collision, such as collision with object(s) in the shortest route or close to the shortest route, for example in such way that the removal tool can be brought to the target with the shortest route but avoiding collision with any objects during the movement. This may require using sophisticated algorithms disclosed herein.

In case or two or more different coordinate reference systems assigned for different parts, such as one or more cameras and one or more movable means, the coordinate reference systems may be rescaled to match. A main coordinate reference system may be defined, to which the other coordinate reference systems are rescaled and/or adapted. The main coordinate reference system may be a global coordinate reference system and the other coordinate reference system(s) may be local coordinate reference system(s). For example a moving means, such as a robot arm, may be assigned to a local coordinate reference system. For example a camera and an active tool, such as a removal means, may be assigned in different local coordinate reference systems, or in case they are combined, which is the case wherein the camera and the tool are installed into the same robot arm, they both may be assigned to the same (local) coordinate reference system.

By using the information obtained with the imaging, radiating and/or acoustic devices, the system creates a model of the circuit board, so a model, such as 2D and/or 3D model of the circuit board is obtained. The model includes at least one of the width, length and height of the circuit board, and it may include a location or a position of one or more component(s) on the circuit board. Also the location and/or orientation of the object, for example in a transporting means such as a conveyor belt, may be detected. This information may be included in the model or it may be used separately. The information may be used for adjusting the holding means or other means.

A 3D model may include a 3D main coordinate reference system. It includes information from one or more types of image(s), such as colour information, grayscale information, depth information, density information, dimensions and/or the like information. This information may be processed and combined to create the 3D model, which may comprise for example a density model. Density information may be derived from the object for example by using radiation imaging.

In addition to imaging, the object may be characterized by measuring one or more dimension(s) of the object. One or more measuring device(s) or means may be provided, such as one or more angular measurement device(s) and/or one or more pressure measurement device(s). Examples of such devices include pressure sensors and angular measurement sensor preferably attached to a worm. This way the width, length and/or thickness of the object may be measured or determined. This information may be used for creating and/or refining the model, and to adjust the transporting means and/or the holding means to adapt to the object.

The imaging and/or measuring may be carried out for an object of a first stage, for an object of a second stage, or for both. For example an object containing a casing may be first imaged, characterized and/or recognized, and this information may be used for processing the casing to expose a circuit board, which may be then separately imaged and/or measured, as discussed herein. In such case two sets of information, or two models, may be obtained: one for an object of a first stage and one for an object of a second stage The information obtained from the object, such as a circuit board, such as the information obtained from modelling means the object or from imaging means the object, may be digital information or it may be digitized into digital information, which digital information may be transferred and/or saved to a memory means or system, which may be centralized or decentralized, encrypted or unencrypted, such as one or more hard disk(s), one or more server(s) and/or one or more cloud service(s). These may be based on block chain systems. The systems may contain or be connected to one or more databases comprising information of components, circuit boards, devices and the like which are or have been (obsolate, eol) commercially available, for example from hardware manufacturers. By using the database(s) or the information contained in the database(s) it is possible to enhance, speed up and/or enable recognition, classification and/or separation of the components, circuit board or devices currently in the system, especially in real time. The required algorithms for these action or operations may be carried out at centralized or decentralized system, such as in a cluster of servers, cloud service or block chain based system.

By using block chain based systems and solutions it is possible to make illegal or unauthorized copying of digital data models, computing principles, algorithms and other method or control features or functions in digital form more difficult or even impossible. This enables providing, in addition to providing or selling the sorting systems, also platform suitable for service based services and enables efficient way to control software and data libraries in centralized way. It also enables a cost efficient way to manufacture the component sorting and disassembling devices disclosed herein, because the computation can be farmed out in a cloud and less computing power and memory is required at the actual sorting devices or systems and in the embedded systems or programmable logics controlling the devices or systems.

The model can be used for defining, creating, optimizing and controlling the paths of a removal tool, grabbing tool or other movable tool, and to select or define a suitable approach angle and positioning of the tool. The model can be also used for detecting components, such as components containing hazardous compounds or valuable compounds, or for detecting materials from the object, such as such as metal(s) present in the component(s) or metal(s) present as a coating in the object, for example coating compounds on a board. The model may include information about recognized material(s) in the object, or the composition of the material(s), the location, shape and/or area of the material(s) and the like information which may be used for using the tools or means disclosed herein. One or more suitable algorithm(s) for defining these and other movements can be provided and/or calculated by the system, preferably by a control unit of the system.

The components may be modelled and/or identified from the obtained model by comparing to a database but also by modelling dynamically, automatically, semiautomatically and/or manually, especially when the database does not contain corresponding data or there is not enough data to make a successful comparison to the database. In the modelling case one or more general features are created or obtained, which can be used to classify the component. One example includes feature extraction, which may comprise shape detection. For example ICs are usually rectangles or squares in 2D model or cubes in 3D model or coordinate reference system, and have x number of connectors, whereas capacitors may be for example 2D circles or 3D cylindrical forms. Feature extraction may also include size and/or dimension based classification combined with the shape, which may be used for example to detect or classify different sizes of ICs and capacitors. Other features useful for modelling components include pixel intensity and/or spectre, colour histogram, and gradient histogram. For example gradient from a pixel intensity of an image may be used separately for depth image and for RGB image, and the information may be combined or fused. The basic idea is to pick the characteristic and/or essential features of an component from an image or a model. Methods or algorithms involving edge detection, corner detection, blob detection, ridge detection, template matching, Hough transformation and/or Wavelet transformation may be utilized to find or detect such features.

Image Analysis and Control of the System with Algorithms

The control unit may contain software code operative to carry out one or more operations for carrying out the method disclosed herein. The software may include one or more algorithms for creating the model using the obtained information and/or for carrying out the other actions disclosed herein. The algorithm(s) may include pattern recognition algorithms, optical character recognizing algorithms, and/or other computing algorithms for example to classify the components in the object into component types. It is possible to obtain two or three dimensional profile of the object, such as a circuit board, and/or to obtain exact dimensions of the object, positioning of a casing, positioning of a circuit board, positioning of one or more component(s) or combinations thereof. The make or model of a casing, a circuit board and/or a component may be recognized by comparing to a database. This and other applicable information may be recognized, computed and/or obtained, and the information may be saved in a digital memory, such as onto a mass memory, cloud or a server. It is possible to create library of the casings, components and/or circuit boards, either by using detected information or information from existing data bases, or from a combination thereof. When the library or libraries include enough data, it is possible to use data mining, neural networks, statistical classification, genetic algorithms, fuzzy logics, deep learning and/or AI algorithms and/or different hybrid methods, or combinations thereof, to optimize the efficiency of the process, carry out predictive analysis of the recyclable objects and materials, optimize processing and timing of the removal of the components, optimize optimal positioning of the removal tools, optimize suitable removal tools, optimize the route of the removal tool and/or the like.

In one example object recognition and/or analysis, such as circuit board and/or component recognition and/or analysis, is carried out with a neural network, such as a convolutional neural network, and/or with an AI. The neural network/AI needs training to enhance the performance and to obtain reliable recognition of objects and parts and details thereof. In general one or more training sets are carried out and completed.

The training may be manual, semiautomatic and/or automatic. Cases of manual or semiautomatic training of neural network/AI may involve human as an operator. In general during imaging, an imaging system, such as scanning system, such as a robot, images the object, such as a circuit board, from two or more angles, for example takes one or more photos from two or more angles. Two or more images may be combined using suitable image processing software/algorithm to obtain a more complete image. After this in the training the operator selects from the obtained images from different angles same or similar components, such as components belonging to the same group, for example MLCC components or IC circuits, by using a designated software with suitable user interface, and informs the software to which class(es) the selected components belong. With this principle a number of circuit boards or other objects are scanned and components are recognized to obtain a large sampling of the components so that the neural network/AI can be taught to reliably recognize the components by calculating the loss.

A term epoch is used to represent a time period in which our entire training set has been covered. During the entire training process, as many epochs as necessary are done to reach the desired level of accuracy. This may include the following steps:
1. Get batch from the training set.
2. Pass batch to network.
3. Calculate the loss (difference between the predicted values and the true values).
4. Calculate the gradient of the loss function w.r.t the network's weights.
5. Update the weights using the gradients to reduce the loss.
6. Repeat steps 1-5 until one epoch is completed.
7. Repeat steps 1-6 for as many epochs required to reach the minimum loss.

AI for Circuit Board Recycling

Some examples are presented to illustrate how circuit boards may be imaged and processed. The following examples or parts thereof may be freely combined with other embodiments and examples where applicable.

2D/3D Digital model creation and component identification from scrap PCB boards.

One or more laser line scanners, 2D or 3D (RGB-D) high definition cameras may be assembled in programmable and controllable XYZ linear gantry system or robot arm to be used for visually scanning the 2D and or 3D surface of the PCB board. The PCB is illuminated by several light sources comprising a group of LEDs (Light-emitting Device) of different colors arranged in a hemispherical manner. In this way the 3D modeling system is able to generate full featured (sub mm accuracy) digital model construction of the PCB board.

Calibration and Localization

High Definition camera/cameras are calibrated by using the process of estimating the intrinsic, extrinsic, and lens-distortion parameters of a camera to correct for any optical distortion artifacts, to estimate the distance of an object from a camera, to measure the size of objects in an image, and to construct 3D views. Automatic detection and location of checkerboard calibration pattern can be used, including corner detection with sub-pixel accuracy for the estimation of all intrinsic and extrinsic parameters, including axis skew, calculation of radial and tangential lens distortion coefficients correction of optical distortion. Overall measurement tolerance requirement is based on the smallest PCB object/component dimensions and typically from sub mm down to 1 μm accuracy.

Each camera senses information pertaining to an object's position with respect to its own coordinates. Information may be collected from multiple sources. In order to direct physical actions, the coordinates then need to be transformed into a coordinate system known by a robot. Calibration is needed to discover the correct parameters for the coordinate transformations.

Calibration of the Depth Image

RGB camera (e.g. High Definition) and depth sensor may have different pixel resolution matrix and in such case alignments needs to be calibrated. This means that optical axis of each camera is fixed perpendicular to the fixture plate so that the image planes are parallel to the fixture plate. The calibration can be performed in two steps: image alignment, and distance calibration. For image alignment an affine 2D transformation (2D rotation, scaling and translation) can be applied to depth image (source image coordinates) in order to geometrically align the pixels to the colour image (destination image coordinates).

Distance calibration may be performed by comparing sensed distances to measured actual distances. The actual distance between the depth camera and the upper surface of the fixture plate may be physically measured. The distance used for calibration is the average distance of four reference points located near the corners of the fixture plate.

2D/3D PCB modelling process starts by obtaining sequenced, indexed and or time stamped RGBD digital images or video streams from an acquisition chain (camera, lighting, lens). The resulting images represents a scene (objects, shapes, background, depth). This scene actually is a matrix of pixels, with a single pixel being the smallest unit of the entire image. The matrix contains the following information on each pixel:location by row & column; light intensity level measured in grey scale for black & white images, Red, Green, Blue for 2D color images and additionally depth (RGB-D) values for 3D images.

Image Pre-Processing

The purpose of image pre-processing algorithms is to improve and/or to enhance the digital images. It may be important for correction of geometric distortions, removal of noise, grey level correction and correction for blurring. In order to remove unwanted noise the GLPF and Morphology Analysis (Area Open) and other algorithms may be be used. In some cases color conversion of the single-channel image from the original image to grayscale by using the difference between red and green channel, and then normalize it due to special color characteristics of PCB such as reflections of different materials used within the PCB.

OCR Method for Identifying Components in PCB

Image pre-processing for optimal OCR recognition results.

Non-linear Smoothing and Contrast Improvement algorithms may be used for enhancing better readability of characters due to fact that there is always a good contrast between texts and background. To represent the contrast information, all color images are first converted into gray images. Since texts can be found not only on substrates, but also on components with different distance values to the camera, a slight blurring of text contours is unavoidable.

Furthermore, color fringes images. In order to restore sharp edges of characters, e.g. Perona-Malik diffusion may be applied. While significant gradients are preserved and strengthened, regions with low contrast are smoothed. A further improvement of the image quality can be achieved by enhancing the overall contrast if necessary caused by chromatic aberrations are also present in thresholding can be used to capture the contrast information in complex scenes correctly, local thresholding methods are preferred to global variants.

2D images can be used for shape, OCR (optical character recognition) and identifying two dimensional components based on features such as size, shape/geometry, pixel intensity and/or spectral analysis for example by using template, shape, size and/or spectral pattern matching algorithms.

Component identification from scanned digital model may be based on OCR text recognition to obtain the type designation of the components and applying database search methods for additional information such as dimensions/geometry, 2D/3D models, type, Bill of materials, value, classification between green and/or hazardous type, suitable recovery tool for removal and recovery tool related parameters such as (point of impact position, tool alignment to component, impact force N, actuation type e.g single shot, multiple shots and actuation frequency, actuation stroke) from pre-modeled electronic component and/or PCB board library database, which may be existing component library database(s), such as Autocad component library/database.

2D images may be used to obtain location coordinates, sizes, shape etc of the identified components within the PCB board. Components may be grouped based on preselected formulation such as IC's chips (CPU, FPGA etc), MLCC, capacitors, resistors etc and optimal moving paths of the robot's recovery tool may be calculated for each calculated clusters and/or groups.

Other Methods for Identifying Components from 2D/3D PCB Model

In such case where obtained component within the scanned model cannot be identified either due missing or blurred type designation text then geometry, color, size, shape and/or spectral analysis may be used as generalized method(s). For example identification may be based on using component's pins count, size and 2D/3D geometry, shape and/or spectral analysis for identification. In this case more generalized rules may be applied for pre modelled (feature extraction) component types which are stored in database library for optimal matching and identification.

Component details PCB & Component Footprints & 3D Models are stored e.g. in Graph DB, Conventional DB and may be pre-trained e.g. for AI or other object classification and/or recognition algorithms e.g. from standard Auto CAD libraries (2D footprints and/or 3D models data formats such as IGES, STEP etc) or dynamically obtained from scanned PCB 2D/3D model if not available in DB, then stored in DB and post trained for AI or other methods for future usage.

Features obtained from the raw sensor used for identify components from the PCB may be e.g set of pixels (color/ lightness intensity), cropped part of image, a location, an edge, a corner or any combination of such measures. Some methods of classification is applied whether or not a region in the image is qualified as an instance of the object of interest. Regions of the image can be segmented in to different regions to be separately analyzed. Details such as shapes, geometry, size, color histogram, gradient histogram, area etc features of known instances of the components are required in order to accomplish comparison and identification of the components within PCB.

3D Data Registration Pipeline and 3D Data Processing of Scanned PCB 3D data structures of the data obtained from the sensors may be stored in various formats such as PCT, Triangle mesh, Line Set, oc/-tree, kd-tree, RGBD image, 2D image, Depth image.

Various 3D data processing algorithms can be applied such as odometry, Registration of data, volume integration, mesh processing, watertight checking, geometry conversion, scene reconstruction, surface alignment, 3D visualization, colormap optimization, semantic segmentation, Machine learning and/or Deep learning etc may be applied for the obtained model data.

The first step is to generate local scene fragments from indexed RGBD sequences and followed by registering fragments in PCT (point to clouds) and getting transformations among fragments There are multiple Point Cloud related operations (or PCL) for 2D/3D image and point cloud processing. The PCL related operations contains numerous state-of-the art algorithms including filtering, feature estimation, surface reconstruction, registration, model fitting and segmentation.

These algorithms can be used, for example, to filter outliers from noisy data, stitch 3D point clouds together, segment relevant parts of a scene, extract keypoints and compute descriptors to recognize objects in the world based on their geometric appearance, and create surfaces from point clouds and visualize them.

Integrate scene fragments into full scene Integration can obtained by using for example template matching or Deep learning networks and/or architectures such as using AI frameworks, for example Tensorflow, Gaffe, Keras etc.

AI/Machine Learning, Deep Learning Use Cases

1. Using RGB+Depth Fusion for Real-Time Component Detection in PCB Board

The combination of depth information with normal RGB data may be used with CNNs to improve the accuracy on the classification task. This may include fusing depth information on top of normal RGB data for camera-based object detection to increase the performance of single-shot detection networks. Depth sensing is easily acquired using depth cameras with RGB for example with single-pass convolutional neural network (CNN) architectures such as Yolo or its variants (YOLOv2 and YOLOv3), SSD, R-CNN, Faster R-CNN and/or other known deep learning architectures enabling real-time processing with hardware acceleration, such as GPU and parallel computing power enhancement such as CUDA whereas the basic idea is to use GPU (Graphical Processing Unit) for parallel programming, which provides better performance for solving complex problems.

Most deep learning architectures for object detection can be labelled as either "one-stage" or "two-stage" method. The one-stage method detects the desired objects directly from the original image, while the two-stage method usually proposes bounding boxes as the regions of interest (ROI) in the first place, and find the objects from the proposed regions The convolutional layer performs convolutional operation and extracts a feature, such as color histogram, gradient histogram, area etc. By stacking multiple convolutional layers, the network grows "deep" and it enables the model to extract features in higher levels. Generally, after the convolutional operation in the convolutional layer, a non-linear function, called activation function, is applied to improve the expressivity of the network. In the CNN, a commonly used activation function is ReLU, which stands for Rectified Linear Unit. The pooling layer acts as a feature-selecting process by down-sampling the feature map and significantly reduces the number of parameters. Most of the CNN implements max-pooling, which selects the maximums during the pooling operation. The fully connected layer is usually for high-level reasoning in image classification. With high-level features extracted by convolutional and pooling layers as input, multiple fully-connected layers combine the features and yield the final prediction of the class.

Data Requirements

In order to train a custom model labelled data is prepared. Labelled data in the context of object detection comprises images with corresponding bounding box coordinates and labels, such as the bottom left and top right (x,y) coordinates+the class.

General Object Detection Framework

Typically, there are three steps in an object detection framework.

First, a model or algorithm is used to generate regions of interest or region proposals. These region proposals are a large set of bounding boxes spanning the full image (that is, an object localisation component). In the second step, visual features are extracted for each of the bounding boxes, they are evaluated and it is determined whether and which objects are present in the proposals based on visual features (i.e. an object classification component). In the final post-processing step, overlapping boxes are combined into a single bounding box (that is, non maximum suppression).

Region Proposals

Several different approaches exist to generate region proposals. The 'selective search' algorithm may be used to generate object proposals. In short, selective search is a clustering based approach which attempts to group pixels and generate proposals based on the generated clusters. Other approaches use more complex visual features extracted from the image to generate regions (for example, based on the features from a deep learning model) or adopt a brute-force approach to region generation. These brute-force approaches are similar to a sliding window that is applied to the image, over several ratios and scales. These regions are generated automatically, without taking into account the image features.

An important trade-off that is made with region proposal generation is the number of regions vs. the computational complexity. The more regions are generated, the more likely it is possible to find the object. On the flip-side, if all possible proposals are exhaustively generated, it will not be possible to run the object detector in real-time, for example. In some cases, it is possible to use problem specific information to reduce the number of ROI's.

Feature Extraction

The goal of feature extraction is to reduce a variable sized image to a fixed set of visual features. Image classification models are typically constructed using strong visual feature extraction methods. Whether they are based on traditional computer vision approaches, such as for example, filter based approached, histogram methods, etc., or deep learning methods, they all have the exact same objective: extract features from the input image that are representative for the task at hands and use these features to determine the class of the image. In object detection frameworks, pre-trained image classification models can be used to extract visual features.

2. Model-Based 3D Pose Estimation of a Single RGB Image Using a Deep Viewpoint Classification Neural Network Used for Reconstruction of 3D Models of Scanned PCB Boards.

Reconstructing 3D models from an image sequence such as RGB-D video stream may be used for 3D model based component identification in PCB and path navigation for component extraction robot having removal tool. To reconstruct a 3D scene model from an RGB video requires an accurate pose estimation algorithm which augments the input video with an additional depth channel and transforms each frame into an RGB-D image. Putting all of these together, an image-based scene model can be reconstructed from an RGB video captured by a moving camera.

A prelearned image model of the PCB target scene is first reconstructed using a training RGB-D video. Next, the model is analyzed using the e.g. multiple principal analysis to label the viewpoint class of each training RGB image and construct a training dataset for training a deep learning viewpoint classification neural network (DVCNN). For all training images in a viewpoint class, the DVCNN estimates their membership probabilities and defines the template of the class as the one of the highest probability. To achieve the goal of scene reconstruction in a 3D space using a camera, using the information of templates, a pose estimation algorithm follows to estimate the pose parameters and depth map of a single RGB image captured by navigating the camera to a specific viewpoint. Image-based 3D scene modelling is predicated on the assumption that the observed imagery is generated by joining multiple views of a 3D scene 3. Deep Learning Driven Optical Character Recognition (OCR) for PCB Component Identification.

PCB component related label text are considered as Unstructured Text, which may be text at random places in a natural scene, sparse text, text with no proper row structure, with complex background, at a random location in the image, and/or with no standard font.

Text recognition involves two steps: first, detecting and identifying a bounding box for text areas in the PCB image, and within each text area, individual text characters, and second, identifying the characters.

Specialized deep learning models may be used to localize and detect text in images. The following presents examples of useful models.

Convolutional-Recurrent Neural Network (CRNN)

The CRNN approach identifies words using three steps:

A standard convolutional neural network (CNN): the first layer breaks the image into features and is divided into "feature columns". These columns are fed into a deep-bidirectional long short term memory (LSTM) cell, which provides a sequence, identifying the relationship between the characters. The output of the LSTM cell is fed into a transcription layer, which takes the character sequence, including redundant characters, and uses a probabilistic approach to clean the output.

Recurrent Attention Model (RAM)

The RAM model is based on the idea that when the human eye is presented with a new scene, certain parts of the image catch its attention. The eye focuses on those "glimpses" of information first and obtains information from them.

In the model, the image is cropped to different sizes around a common center, and glimpse vectors are created with prominent features from each cropped version. These glimpse vectors are flattened and passed through a "glimpse network" based on visual attention.

Glimpse vectors are then passed to a location network, which uses an RNN to predict the next part of the image to pay attention to. This location is the next input for the glimpse network. Gradually, the model explores additional parts of the image, each time performing backpropagation to see if the information from the previous glimpses is good enough to achieve a high level of accuracy.

Attention-OCR

Attention-OCR is an OCR project available on TensorFlow (machine learning platform), and was originally designed for the problem of image captioning. It's structured as a CRNN followed by an attention decoder.

First, the model uses convolutional network layers to extract image features. It encodes these features to strings and passes them to an RNN, followed by an attention mechanism, borrowed from the Seq2Seq machine translation model. The attention-based decoder is used to predict the text in the input image.

Standard Open Source OCR Dataset Libraries for Deep Learning

The following standard datasets can be used pre-train a model on a large number of labelled images.

MNIST is a computer vision challenge, showing one handwritten character at a time, which may be one of the 10 numerical digits (0-9). MNIST is considered an easy task for neural network classification models.

SVHN—The Street View House Numbers dataset, extracted from Google's street view. Digits are in assorted shapes and writing styles; however, the house number is always in the middle of the image, so text detection isn't needed.

Street View Text Dataset (SVT)—A more challenging OCR task involving outdoor images with noise, image artifacts, and lighting issues to deal with.

The images in this dataset generally cannot be processed by legacy OCR algorithms.

4. Using Deep Neural Network (DNN) Based Robotic Removal Tool to Enable Autonomous Motion Planning for Computing a Collision-Free Path for the Given Start and Goal Configurations.

In order to guide component removal robot to navigate between different parts of the environment to remove selected group of components without collision with other objects and surfaces within digitalized 3d models and/or PCL, robots need a map of the environment. They also need to localize themselves in the map to estimate their current position. To do this, robots may be equipped with exteroceptive sensors like monocular and stereo cameras, laser range finders, inertial measurement units (IMUs), and RGBD (RGB color information with depth) sensors. A SLAM (Simultaneous Localization and Mapping) module builds the map of the environment and simultaneously localizes the robot in the map. The localized position of the robot is the start location, and the goal location is specified for the robot for it to navigate towards the goal using any of the state-of-the-art path planning algorithms. SLAM is considered to be a core module for autonomous robots because it is often a prerequisite to path planning, navigation, and manipulation for single and multi-robot systems Useful computationally efficient motion planning methods include various sampling-based motion planning (SMP) algorithms such as Rapidly-exploring Random Trees (RRT), optimalRapidly-exploring Random Trees (RRT*), Potentially guided-RRT* (P-RRT*) and their bi-directional variants.

Some approaches useful for path planning include cell decomposition (CD), roadmap approach (RA), artificial potential field (APF); reactive approaches such as genetic algorithm (GA), fuzzy logic (FL), neural network (NN), firefly algorithm (FA), particle swarm optimization (PSO), ant colony optimization (ACO), bacterial foraging optimization (BFO), artificial bee colony (ABC), cuckoo search (CS), shuffled frog leaping algorithm (SFLA) and other miscellaneous algorithms (OMA).

Deep Reinforcement Learning (DRL) may be used for component removal robot's waypoint and/or pathway trajectory control and planning.

Despite previous efforts to design fast, efficient planning algorithms, the current state-of-the-art struggles to offer methods which scale to the high-dimensional setting that is common in many real-world applications.

To address the above-mentioned challenges one example uses a Deep Neural Network (DNN) based iterative motion planning algorithm, called MPNet (Motion Planning Networks) that efficiently scales to high-dimensional problems. MPNet consists of two components: an encoder network and a planning network. The encoder network learns to encode a point cloud of the obstacles into a latent space. The planning network learns to predict the robot configuration at timestept+1 given the robot configuration at time t, goal configuration, and the latent-space encoding of the obstacle space. Once trained, MPNet can be used in conjunction with our novel bi-directional iterative algorithm to generate easible trajectories. MPNet can be evaluated on a large test dataset including multiple planning problems such as the planning of a point-mass robot, rigid-body, and 7 DOF robot manipulator in various 2D and 3D environments. As neural networks do not provide theoretical guarantees on their performance, it is recommended to use a hybrid algorithm which combines MPNet with any existing classical planning algorithm, such as RRT* for achieving 100% success rate consistently over all tested environments while retaining the computational gains. MPNet generalizes very well, not only to unseen start and goal configurations within workspaces which were used in training, but also to new workspaces which the algorithm has never seen.

MPNet is a neural network based motion planner comprising phases: (A) offline training of the neural models, and (B) online path generation. Offline TrainingOur proposed method uses two neural models to solve the motion planning problem. The first model is an encoder network which embeds the obstacles point cloud, corresponding to a point cloud representing Xobs, into a latent.

Encoder Network (Enet) embeds the obstacles point cloud into a feature space. Enet can be trained either using encoder decoder architecture with a reconstruction loss or in an end-to-end fashion with the Pnet. For encoder-decoder training, we found that the contrative autoencoders (CAE) learns robust and invariant feature space required for planning and generalization to unseen workspaces. The reconstruction loss of CAE. For Planning Network a feed-forward deep neural network can be used. To train Pnet, any planner or human expert can provide feasible, near-optimal paths as expert demonstrations. The training objective for the Pnet is to minimize the mean-squared-error (MSE) loss between the predicted states^xt+1 and the actual states xt+1 given by the expert data.

In Online Path Planning an online phase exploits the neural models from the offline phase to do motion planning in cluttered and complex environments. To generate end-to-end feasible paths connecting the start and goal states, the incremental bidirectional path generation may be heuristic. Algorithm presents the overall path generation procedure and its constituent functions.

Other deep learning architectures for complex 3D path planning for component removal robot and/or tool may be also used.

One example provides deep learning-based control and operation of robot manipulators. More particularly a robot path planning method may use a deep Q-network algorithm with emphasis on learning efficiency. For path training, a stereo image may be used to train DDPG (Deep Deterministic Policy Gradient), a real robot is trained using reinforcement learning for its path planning.

In another example a gradient-based path planning algorithm may be used. To this end, RAMDP (Robot Arm Markov Decision Process) is defined first. In RAMDP, the state is the joint angle of the robot manipulator and the action is the variation of the joint angle. Then, DDPG (Deep Deterministic Policy Gradient) with HER (Hindsight Experience Replay) is employed for the purpose of searching the optimal policy. DDPG is applied since the action in RAMDP is a continuous value and DDPG is devised for MDP with a continuous action. The twin delayed DDPG enhances performance of DDPG so that it shows good convergent property and avoids overestimation.

The model may be created or constructed by using machine vison methods and devices, or the machine vision technology may be used to further refine the model and/or to control the movement of actuators and movable means for handling the objects. For example machine vision may be used to control the removal tools and to monitor the quality of the process and to recognize materials. Machine vision integrated to a robot or robot tool may be used to recognize or model profiles and/or dimensions of casings, circuit boards, and/or components. A removal tool may be integrated with a suitable holding, picking and/or grabbing mechanism, which may be used during removal of the component to hold the component and/or after removal to pick up the component and to move it to a selected collecting receptacle, preferably according to a classification of the component. To enhance the removal process it is possible to provide two or more robot cells in parallel or in series.

Removal Means

The device comprises one or more removal means, for removing or for detaching one or more electronic component(s) from the object, such as from the circuit board. These means may be called removal tool(s) or detaching tool(s). The device may comprise one or more (removal) means for removing one or more casings, coverings or other additional parts attached to the circuit board. These means may be same or different. In one embodiment the removal means comprises one or more robot arm(s). One or more tools disclosed herein may be integrated to the robot arm.

The removal means or tools are arranged to remove or detach, such as to cut or break, the connection(s) between a component and a support to which it has been attached, such as a circuit board. The removal means may be arranged or provided to detach soldered components from the support, which may be carried out without treating the solderings. This is obtained by using energy to break the connection(s), such as one or more of pin(s), wire(s), or other connector(s) between the component and the support. The connections between the component and the support may comprise soldering. Mechanical energy may be provided for cutting, abrading, sawing, hammering or the like action to cut the pins, wires or connectors. Heat may be provided preferably to a specific areas at or near the component, such as to one or more spots (s) or line(s) having a narrowest diameter in the range of 0.5-10 mm, such as 1-5 mm, which may be enough to melt a connector or a welding attached to a connector. After cutting or breaking the connections the component can be released or recovered from the support by using suitable picking or recovery means. The present method is preferably carried out without heating the whole object or substantially the whole object, such as without melting all or substantially all the solderings in a circuit board to release the components. The present method may be carried out even without heating the object at all, and/or without treating the solderings in the object.

The removal means comprise cutting or breaking means for the connection(s) of the component i.e. the removal means is responsible for detaching and/or releasing the component from the support. The removal means may or may not comprise picking and/or recovery means for picking and/or recovering the released component. Such picking and/or recovery means may be separate means from the removal means, or they can be integrated to a part, such as a movable arm, including the removal means. The recovery means may include an imaging means, such as a camera, scanner or other sensor or suitable device, which may be operatively connected to a control unit and which may be used for monitoring and/or controlling the recovery means and recovery action. For example a removed component may be localized and the removal means can be directed to pick up the component.

The system may comprise a selection of different removal means, such as two or more, which may be used for different purposes, such as for removing different components. The method may comprise selecting a suitable removal means for each component from two or more removal means, and removing the component by using the selected removal means.

For example a selection of two or more removal means, which may be removal tools, may be provided, for example in a rack or other support available for one or more moving member, such as a moving arm, for example a robot arm. The moving member may pick a selected removal means from the selection of two or more removal means, which selected removal means is attached to the moving member by a suitable connecting means. A removal means is removably connected to the moving member, so a first removal means may be attached, used and detached, and a second removal means may be used thereafter in a similar way.

The moving member may be a robot with X degrees of freedom. The number of degrees of freedom is equal to the total number of independent displacements or aspects of motion. A machine may operate in two or three dimensions but have more than three degrees of freedom. Each path, or independent displacement, carried out by the robot is operated by one or more actuators for moving the movable member, such as servo motors. There are however limitations for the maximum load for an actuator and/or for connected power transmission mechanics both with momentary and continuous load. For example if a removal means, which is heavy or otherwise causes a high load for the equipment, is used, it has an impact to the maximum speed of the device, such as the robot, or the power of the actuator is not adequate, the power consumptions increases radically, and so on. Especially removal means or tool(s) providing pulse(s) of mechanical energy, more particularly an actuator arranged to provide pulsed movement, such as an air hammer, air chipper or the like removal means providing high impact and recoil may have a negative effect to the connected actuators moving the movable member, which may be (over)loaded by the mechanical impact or must be oversized in relation to other parts of the setup. In the present system the actuators moving the movable member(s), such as servo motors, may include controllable braking or locking means, such as servo motor brakes, which may be implemented with permanent magnet brakes. The actuator may be braked or locked by using these means via programmable logic and/or as controlled by the control unit. For example when the air hammer or the like tool is instructed to provide an impact to the target, the actuators are also locked or braked with the braking or locking means, which may be permanent magnet brakes, for example servo motor brakes. Therefore the actuator better tolerates the recoil or other impact caused by the removal means. Another option would be to provide a similar permanent magnet brake, solenoid or other controllable braking or locking means to lock a corresponding joint or transmission mechanics during the impact. In this way the recoil does not have an impact to the servo motor or other corresponding actuator or to mechanical parts of the system. After the action with the removing means the locking or braking may be released.

The removal means may be arranged to selectively detach or remove one component from the object at a time. Correspondingly the method may comprise selecting a component to be removed, and/or removing a selected component, preferably removing one component at a time. This may be carried out as a one step.

The one or more removal means or removal tools may comprise one or more tools selected from a water cutting tool, an air hammer, an air chipper, a die, a knife, a guillotine cutter, a milling tool, an ultrasound cutting tool, an electrochemical removal tool, such as ECM (electrochemical machining), Jet-ECM or inverse Jet ECM, a laser cutting tool, a plasma cutting tool, a soldering device, an infra-red heater, a heating element, preferably for a limited area in the range of 0.2-10 cm, such as 0.2-1 cm or 0.2-0.5 cm, a pressing tool, a clamp tool, a grinding wheel, a disk saw, diamond wire cutting tool, or a combination of two or more thereof.

An electrochemical removal tool, which may also be called as electrochemical cutting tool, utilizes electrochemical process for removing metal. A high current is passed between an electrode and the part to be removed, and conductive fluid (electrolyte) may be provided. In the ECM process, a cathode (tool) is advanced into an anode (the metal part in the object). The pressurized electrolyte is injected at a set temperature to the area being cut. A working gap between the tool and the workpiece may be in the range of 80-800 μm. As electrons cross the gap, material from the object is dissolved. The electrolytic fluid carries away the metal hydroxide formed in the process, which may be the recovered. In Jet ECM the electric current is restricted to a confined area by a jet which leads to a high localization of the removals. The removal amount and the machining position can be controlled by setting the electric current and the nozzle position. Even complex structures can be machined with the continuous direct current. Inverse Jet-ECM is based on a localized anodic dissolution of the work piece i.e. the object that is connected to a positive electric potential. A negative or zero potential is connected to the tool which is the cathode. The electrolyte jet determines the localization of the current density and therefore the shape of the edge rounding. The advantage of this process exists in the possible high localization of the erosion area and high achievable surface quality. A micro bore is applied, which is imposed on the anodic pole while a cathodic polarized metallic surface displays the antipole. The electrolyte is pumped through the bore and ejected with an average speed of approximately 10 m/s. The electrolytic liquid forms a free jet with a well-defined shape. Thus, the distribution of the current density is limited to a confined area at the front edge of the micro bore thereby limiting the removal geometry to this area. This guarantees the realization of an edge rounding without influencing the interior bore wall. Inverse Jet ECM is explained in detail for example in Oschatzen et al., Inverse jet electrochemical machining for functional edge shaping of micro bores, Procedia CIRP 6 (2013) 378-383.

An electrochemical removal tool may be accurately directed to a desired location or spot, such as a pin, wire or other connector in a component. It may be connected to an actuator and a mechanism, such as a robot arm, which is controlled by the control unit to guide the tool into target. It is possible to accurately treat surfaces coated with a valuable metal, such as gold, even with discontinuous surfaces at different sides of a circuit board or a component by using reverse electroplating or ECM principles, and to recover the metals.

The device may also comprise one or more removal means for removing filler and/or coating, or filler and/or coating compounds, which may cover the desired components, metal or other targets. These means may be the same or different than the removal means disclosed herein. The fillers or coatings, which may include organic polymers such as resin or plastics or ceramics, may be removed to expose metals, such as precious metals. In one example an integrated circuit or a processor is treated to remove coating to expose metallic parts. The means for removing filler and/or coating may include devices and methods comprising laser IC decapsulation, PCB cutting and other suitable removal tools and methods. In one example cooling flanges and the like parts are removed from processors and other applicable components.

In one example the means for removing filler and/or coating, including filler and/or coating compounds, which may cover the desired (target) components, metal or other targets, especially covering a metal to be recovered in the electronic component to expose the metal, i.e. peeling means, may also include cooling means, especially if the peeling means are such type that cause heating of the treated target. Removing the filler and/or coating as discussed herein may refer to melting, ablation, peeling, decapsulating and/or decapping of such material from a component, for example from an integrated circuit or microchip. This aims to expose the metal of interest, i.e. the metal to be recovered inside the component. The integrated circuits may have been encapsulated in polymer, such as plastic, ceramic, or epoxy. Any suitable decapsulation means and methods may be used for removing the filler and/or coating discussed herein, such as laser decapsulating means and methods, for example laser ablation, or microwave induced plasma decapsulating systems. With the features of the system, such as machine vision, used algorithms, created model(s), and/or the robotic means the peeling step can be carried out fast and accurately without damaging the metal of interest or any surrounding components or surfaces, and the metal parts can be efficiently exposed so they can be further processed. For example the exposed or exposing metal parts may be imaged and modelled during the process with the same principle as the components, and it may be possible to carry out the peeling only to suitable extent, so that only material covering the metal, optionally also partly surrounding the metal, is removed. Using precise means such as laser, especially fiber laser, it is possible to target the removal action accurately to the desired parts of the component.

The cooling means may comprise a source of coolant, such as gas or liquid, for example air, hydrogen, inert gas such as helium and/or carbon dioxide, water, liquid carbon dioxide, liquid nitrogen, and/or the cooling means may include a cooled object. The cooling means may be provided to cool the site of action, especially the target component and/or the corresponding site of the circuit board. The cooling means may include a nozzle for directing the coolant to the target, the nozzle being connected to the source of coolant, preferably also being operatively connected to the control unit in such way, that the flow of coolant can be controlled. In one example the means for removing filler and/or coating comprises a laser, such as a fiber laser, preferably in combination with cooling means. The power of the laser may be selected or adjusted such that efficient peeling is obtained but metals are not melted or otherwise harmed. Therefore it is possible to expose the bond wires or other metal parts of the component without mechanical crushing or other treatment, and preferably to enable chemical leaching of the metal(s). As mechanical treatment is avoided no harmful dust is formed. Further assistance means, such as a source of plasma, may be used.

The present method may comprise removing filler and/or coating, including filler and/or coating compounds, which may cover the desired components, metal or other targets, preferably with the means disclosed herein, especially removing filler and/or coating covering a metal to be recovered in the electronic component to expose the metal, preferably with the means for removing coating and/or filler. This may be carried before the component is removed from the circuit board or wherein the component is attached in the circuit board, and/or it may be carried out after the compound is removed from the circuit board, in which case the component may be hold by a holding means, which may be removing means, recovery means and/or other means, such as suction means, or combination thereof. When the removal of the filler and/or coating is carried out before the component is removed and/or to a component attached to the circuit board, there is no need to use any holding means as the components are still stabilized by the circuit board. The component treated such way may or may not be subsequently removed from the circuit board, so it may be different component from the component(s) which is/are to be removed from the circuit board.

When the removal of the filler and/or coating is carried out after the component is removed, it is easier to target the peeling action or force, such as laser or other energy or mechanical action or force, to the target component and to avoid treating the surrounding components and/or the circuit board. It may be also possible to collect more than one, such as plurality, of removed components, and carry out the peeling treatment to the at the same time, for example when they are placed on a surface such as a conveyor belt, for example as an array of removed components, which may be of same type or of different types. Preferably the exposed metal is recovered, either partly or fully. This may be carried out by using any suitable recovery method, such as any of the methods disclosed herein.

The removed filler and/or coating or other material, as well as formed gases and other emissions or discharges, may be removed by using suitable means such as suction means, for example by providing vacuum preferably with a nozzle, and conveyed away, for example via a tube.

Recovering metals, such as Au, Ag, Pt and/or Cu from exposed bond wires by laser decapsulation can be accomplished by using electrochemical methods and devices, such as reverse electroplating (electrolysis method), in which IC pins are short circuited by using electrically conductive material such as stainless steel 304/316 solid, mesh, or other suitable flexible/porous conductive material or membrane. Therefore the device may comprise a conductive tool for short-circuiting two or more pins, wires or other connectors in the component(s), and the method may comprise providing and using said tool to short-circuit the circuiting two or more pins, wires or other connectors in the component(s). Then a suitable electrochemical device and method may be used to treat the metals in the pins, wires or other connectors as disclosed herein.

A suitable clamping means and method may be used to establish a firm connection between IC pins and short-circuiting electrically conductive material. Alternatively soldered pins or other connectors may be sort-circuited from the opposite side of the circuit board, for example by providing a conducive object, such as a sheet-like object or an object otherwise applicable to the surface of the board, such as a flexible sheet or a part containing a plurality of flexible conductive parts, which are able to electrically connect or short-circuit separate pins or connectors upon application. The conductive object may have a size, such as an area, arranged to cover only the connectors of a specific component, such as a processor or an integrated circuit. The short circuited pins form anode material and have electrical connection between IC pins and exposed bonding wires. Electrically conductive cathode material is placed in a suitable electrolyte chemical in leaching container. Short circuited IC pins are connected to a positive anode and cathode material to negative pole of the DC power supply. Voltage may be for example between 0.1-4.0 VDC, such as 1-3.0 VDC.

The components, such as processors and integrated circuits, may be first recovered, combined and then treated in a further step with these methods to recover valuable metals.

The device may comprise one or more recovery means for recovering the released or detached component(s). The recovery means may be called a recovery tool, a picking tool or a picking means. It may be arranged to deliver the recovered component to a suitable location, such as to a selected container, which may be designated for collecting components of same type or classification. The recovery means may comprise a mechanical grabbing means attached to one or more movable arm(s), or it may comprise a vacuum grabber, which may be attached to one or more movable arm(s). In one example the recovery means comprises vacuum means, such as suction means, connected to a tube for delivering the recovered component to a desired location though the tube, such as to a selected container. Such device may comprise or is connected to a source of vacuum. In one example the recovery means comprises a source of pressurized air and a nozzle, such as a movable nozzle, for moving the removed component(s) from the object by using the air pressure. For example the detached components may be blown from the circuit board by using pressurized air to a desired direction and/or location.

It may be possible to first remove all components of certain type or category, recover them all by using the recovery means, such as by using vacuum or pressurized air, preferably to convey the components to a desired location, and then continue with removal of different type or class of components.

A recovery means may be controlled by using information obtained from imaging the object after the component has been detached. With the imaging information, which may be included in a model, it is possible to lead the recovery means to the location of the detached component for picking.

The recovery means may be separate from the removing means, such as it is connected to separate movable parts, such as arm(s), and separate actuator(s). The movements of these two means can be independently controlled. Alternatively the removal means and the recovery means may be fully or partly integrated to the same moving part(s) and/or actuator(s).

In one embodiment the recovery means comprises one or more robot arm(s). The recovery means may be operatively connected to a control unit.

The means disclosed herein, more particularly one or more of the means, may be operatively connected to a control unit, which is arranged to carry out one or more actions disclosed herein by controlling one or more means, devices, tools or the like contained in the device or the system.

The device or the control unit may be arranged to obtain a model of the object with a means for modelling the object (modelling means). The means for modelling the object may comprise software arranged to create the model, and it may include the imaging means the object.

Obtaining the model of the circuit board may comprise obtaining 2D and/or 3D model of the circuit board, preferably including at least one of the width, length and height of the circuit board, more preferably including location of one or more component(s) on the circuit board.

The device or the control unit may be arranged to adjust the holding means by using the model to adapt to the circuit board and hold it. Using the model may include for example using one or more dimension(s), a position, an orientation and/or other properties of the object, which may be included in the model, to adjust the holding means to find and hold the original object having the corresponding dimension(s) or other properties. Therefore the holding means or the actuator connected to it can be operated in such way that it does not use too much force which could crush or deform the object, and for example so that it can grab the object from a suitable position.

The device or the control unit may be arranged, by using the model, to classify the detected, recognized or identified components, and/or to decide and select which one(s) to remove and which ones to recover. It may not be necessary to remove all the components, but for example only harmful and/or valuable components. This may depend on the further use of the object(s), such as the circuit board, and/or the component(s).

The device or the control unit may be arranged, by using the model, to control the one or more removal means to remove one or more component(s) from the object. Using the model may include for example using a position of one or more component(s), type of one or more component(s), other properties or information related to the component(s), one or more dimension(s) or other properties of the object included in the model to adjust the removing means and optionally other means, such as holding means to remove one or more components preferably in a desired and/or controlled way. For example the removing means can be accurately directed to a correct position at the object, such as the circuit board, to remove the desired component in a desired way. For example by using a suitable tool and exact position of the component, the pins of the component may be specifically cut to release the component, or the soldering may be removed from the pins to obtain the component as undamaged.

The device may be arranged to recover the removed component(s). This includes controlling and using one or more means for recovering the removed components, such as picking, grabbing, pushing or other moving means contained in the device or the system.

Any of the means disclosed herein, preferably all of the means, may be operatively connected to the control unit and optionally also to one or more actuator(s) for actuating the means. More particularly the actuator(s) may be operatively connected to the control unit.

The present application provides a method for disassembling electronics by using the device described herein. The method may comprise providing the device disclosed herein, and carrying out necessary method steps.

The method comprises providing one or more objects, such as circuit board(s), containing one or more electronic components, to the device. The method may comprise feeding the one or more objects to the device, preferably by using a feeding device.

The method comprises imaging the object to obtain one or more digital image(s) of the object.

The method comprises creating a model of the object based on the information, preferably one or more image(s), obtained from the imaging. Creating the model of the object may comprise creating a 2D and/or a 3D model of the object, preferably at least one 3D model and optionally at least one 2D model. Such a model preferably includes at least one of the width, length (or depth) and height (or thickness) of the object. Other features that may be obtained and/or included in the model are one or more of profile, edge, groove, bead, gap, angle, roundness, presence, flatness, deformation, flushness, spectral analysis and classification of materials.

The method comprises locating one or more electronic component(s) from the model. The method may also comprise recognizing or identifying one or more electronic component(s) from the model. Information including the location and/or identity of one or more component(s) is obtained and may be included in the model.

Creating the model of the circuit board may comprise recognizing or identifying the type of the circuit board and/or the type or model of one or more of the components on the board. This may be carried out by recognizing one or more of the following: dimensions of the circuit board, dimensions of the casing containing the circuit board, one or more of patterns(s), text(s) and/or number(s) printed on the circuit board, one or more of patterns(s), text(s) and/or number(s) printed on the casing and/or one or more of patterns(s), text(s) and/or number(s) printed on the one or more of the component(s), and comparing this information to a database comprising information of a plurality of types, manufacturers and/or models of circuit boards, casings and/or components, recognizing matching information and obtaining the model of the circuit board. This information may be included in the model, and it may be used to decide and select which component(s) to remove and recover.

Recognizing may refer to recognizing the type, size, such as one or more dimension(s), or identity of an object. The type may include any suitable classification, such as classification into circuit board types, models, brands or the like, or into circuit boards and other supports, or classification into component types. The recognizing may comprise recognizing one or more of the components in and/or on the object. The recognizing may be carried out after imaging, from one or more images, or from the model created based on the imaging. The information obtained from the recognition may be included to the model.

In case of components the classification may comprise classification into semiconductors, capacitors, resistors, mechanical components and the like; or classification into components containing different types of metals, such as valuable metal(s) and less valuable metal(s), or metal(s) to be recovered and metal(s) not to be recovered; or classification into components containing harmful or hazardous material(s) and components not containing such material(s). Recognizing may also comprise identifying the component. Identifying may comprise identifying a type, a model, a brand, a manufacturer or the like information of a component, preferably by deriving the information from the imaging or from the created model. The component may be identified by detecting one or more of pattern(s), such as logo or the like, text or number(s) or other characters from the component, and preferably comparing with a database of known components containing corresponding information to find a match to identify the component. Information obtained from the recognition, such as the identity of an object, may be included into one or more database(s).

In one embodiment the recognizing comprises identifying the object, such as a circuit board and/or a component, preferably wherein the identifying comprises detecting one or more pattern(s) or character(s), such as text or numbers, on the object, and by comparing this information to a database of known objects, such as a database comprising information of a plurality of types and/or models of circuit boards, casings and/or components, recognizing matching information and obtaining the model of the object to identify the object. The information obtained from the identification may be used for selecting a suitable removal method and/or tool for the component. The device may be arranged to select a removal method and/or removal means based on the identity and/or type of a component, which information may be derived or obtained from a database.

The method may comprise recognizing one or more of the components in the object, selecting the component(s) to be removed and optionally recovered, and removing and optionally recovering said components. Selecting may include deciding, according to a predefined classification, which component(s) are classified as to be removed and/or to be recovered. For example the system, the device or the control unit may decide whether or not to remove a component and or whether or not to recover a component.

Therefore the model may comprise a location of one or more component(s) in the object, such as on a circuit board. The model may also comprise an identity, such as a type, a model, a brand, a manufacturer or the like information, of one or more component(s) in the object.

Existing information about the components, circuit boards and/or the devices may be used for recognizing the detected components, circuit boards and/or the devices. For example one or more data bases may be provided comprising such information, for example from hardware manufacturers, such as device or component manufacturers. Such information may include for example models used for manufacturing the devices or electronics, such as digital models including Autocad or other circuit board designing software models.

These models may include information about the positioning of the casings, circuit boards and/or components used for designing the devices, such as EOL (end of life) devices, which are treated with the present method. This enables efficient cooperation model between the waste operator and the hardware manufacturer. For example the hardware manufacturer could provide hardware information, such as digital files containing the information discussed herein, for example circuit board information, list of components (bill of material, BOM) and the like, according to agreement(s) to the waste operator. The information may be provided in standard forms, such as Autocad format or the like general format.

The method may comprise adjusting the holding means by using the model to adapt the holding means to the object or the and to hold it. Using the information contained in the model enable adapting the holding operation to the object, so that suitable amount of force, suitable angle and/or suitable holding tool and optionally other tool(s) can be selected and used. In this way breaking the object can be avoided, and the object may be moved and processed in optimal way.

The method may comprise selecting a suitable removal tool for removing the component(s) and optionally a removal tool for removing other desired parts or compounds, such as metals.

The method comprises by using the model controlling the one or more removal means to remove one or more component(s) from the object.

In one embodiment the method comprises calculating a path for one or more means or tool(s), such as the removal means, by using the model. The calculating may include defining, creating, optimizing and/or controlling one or more path(s) for one or more of the means or tools such as removal means or tools, and optionally also holding means or other movable tool disclosed herein, such as a grabbing tool. The calculating may also include selecting and/or defining a suitable approach angle and/or positioning of a tool. As a result from the calculating a tool route or path bay me obtained, such as an optimized tool route or path for a specific object, for example a model of a circuit board, which may be then saved as a digital file, preferably in a database.

The method comprises recovering the removed component(s). The recovered component may be applied into separate collecting receptacle(s), one or more, usually according to the type of the component, so similar or identical components can be combined.

FIG. 1 presents a general description of the present method and device setup. A control unit (1) usually includes one or more processor(s), memory, power source, user interface, and is provided with a software arranged to carry out method steps discussed herein. The central unit may include one or more algorithms for providing artificial intelligence (AI), data mining, deep learning, neural network computing, statistical computing, fuzzy logic, genetic algorithms, character recognizing algorithms, pattern recognizing algorithms, principal computing analysis, spectral analysis computing and the like. The control unit may include for example one or more computer(s) and/or embedded system(s). The control unit is operatively connected to other devices and method steps of the present device setup and method, and the communication may be bidirectional. The control unit may receive data from sensors, imaging systems and/or other systems and actuators present in the system. The control unit may operate actuators, valves, energy sources, embedded devices, robots, conveyors and/or any other suitable devices and means present in the system and discussed herein, to obtain desired operations or actions, which may be required to carry out the method. The control unit may be networked, i.e. it may have an access to internet and/or other network(s) or external device(s).

The control unit may be connected to a data storage (2), which may comprise a mass memory, such as one or more hard disk(s), flash memory or other suitable memory, which may be volatile or non-volatile; a cloud; or a server, a distributed block chain based storage or the like applicable data storage means or system. The data storage may be integrated with computing, IOT system properties, remote control such as monitoring and secured connections.

The system contains means or devices (3) for imaging the objects, which may also carry out profiling of the objects, such as profiling dimensions, pattern or character recognition and the like functions.

The system contains means or devices (4) for transporting, feeding and/or holding the objects.

The system contains holding means or devices (5) which adapt to the object.

The means or devices (3), (4) and (5), and method steps carried out with said means or devices, may be in the presented order, in a different order, or the functions or actions may be carried out partly or fully simultaneously. For example the object may be imaged or profiled while it is already transported or fed to a transporting system, such as a conveyor belt. However, at least dimensions or type of the object should be usually defined before the feeding, holding or transporting system can adapt to the object.

The system contains one or more means (6) for removing one or more electronic component(s) from the objects and preferably one or more means for recovering the removed component(s). The removed and recovered components are then collected in one or more containers (7), for example to a series of containers wherein the components are sorted into separate containers according to their type or classification.

EXAMPLES

Example 1

Figure 2:
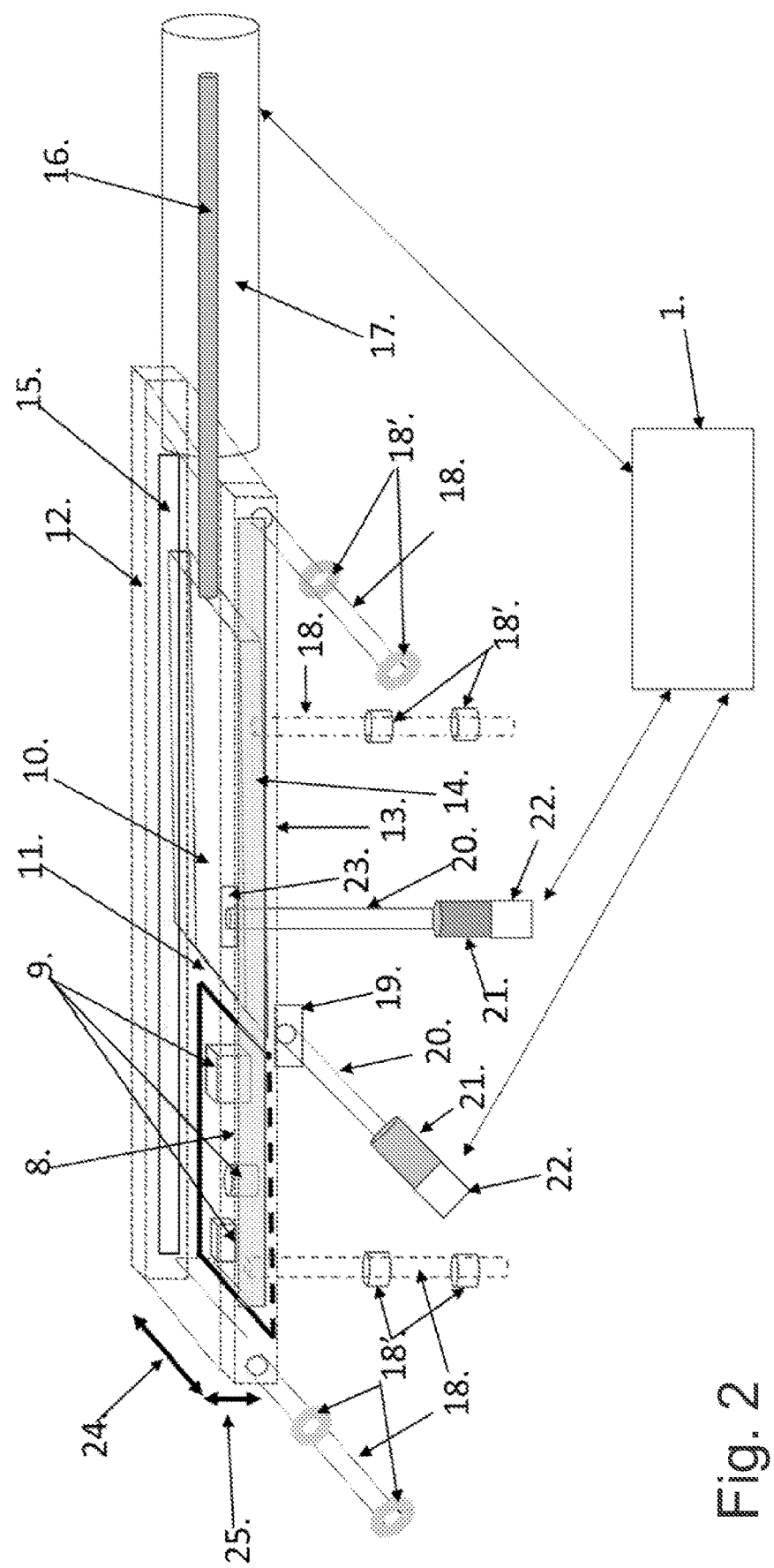
FIG. 2 shows an example of a device setup for removing components from a circuit board with an device which can adapt to different sizes of circuit boards and utilizes a guillotine structure for removing the components.

FIG. 2 shows an example of a device setup for removing components 9 from a circuit board 8. The system includes a cutting blade 10, a bottom plate 11 which is adjustable in vertical direction, fixed edge support 12 with integrated groove for the cutting blade, dynamically adjustable edge support 13 with integrated groove for the cutting blade, linear controllers, motorized set screw to adjust the horizontal position of the edge support and digital angle measurement sensor for measuring the position at horizontal plane. The edge supports include integrated control groove 14 going through the edge support and integrated control groove 15. A pneumatic compressing piston axel 16 is connected to the cutting blade and to a pneumatic compressor 17. The linear controller includes axels 18 and slip rings 18'. To the edge support the is integrated a threaded attachment support 19 for the axel of the motorized set screw 20. The set screw is connected to a motor 21 for adjusting the screw. The system contains an optical angle measurement sensor 22 and a threaded attachment support 23 installed to bottom plate for the axel of the motorized set screw. The adjustable gaps in the horizontal direction 24 and in the vertical direction 25 are shown with arrows.

The modelling of devices or circuit boards or other applicable objects may be simply carried out by using servo motor controlled set screws, linear slides, distance measurement sensors, optical angle sensors, force/moment sensors and programmable logics or embedded systems, for example to model x or y direction/planes width and height dimensions. For example it is possible to utilize the structure disclosed in FIG. 2 containing a set screw and a liner guide integrated with a motor into x and y plane for adjusting a gap between movable edge support/bottom to fixed opposite edge support/upper level, and by optical angle measurement to measure the change in the rotation angle caused by the set screw adjustable with a motor to obtain change in x/y movement. The electronics scrap device or circuit board is applied between the edge supports and by using programmable logic the adjustable edge support and bottom is moved. The position of optical angle sensors is measured and a change in the movement of the adjustable edge supports and bottom level is calculated with an embedded system.

It is also possible to install force/moment sensors and/or distance sensors to edge supports and bottom plate, so that by using programmable logics or embedded system it is possible to analyze the distances between the edge supports and levels and the compression force directed to the electronics waste object between the edge supports and the bottom or upper level plates. With an embedded system by using the measured momentum value from a force sensor it is possible to obtain a value for a change in angle from the angle sensor which corresponds to dimensions of the treated object. By using the information from the force sensor it is possible to adjust a suitable compression force at x/y plane to hold the object during the process.

It is possible to model and treat even complete electronic devices or circuit boards and components therein by modeling surface profiles and dimensions, by analyzing materials, and also profiling and modeling inner structures, for example in devices installed in casings, by using methods wherein the used energy can penetrate surface structures or a casing. Examples of such methods and devices include infra-red, x-ray and ultrasound imaging methods and devices. A complete electronic device may be profiled by imaging and modeling the outside, i.e. outer profile and dimensions thereof, and inside, i.e. inner profile and dimensions thereof, such as locations and dimensions of the components, and from a formed digital model, by using patterns recognition and other computational methods and algorithms, to construct a detailed enough model and/or analysis thereof. This may be then used to create an optimal processing and moving path for movable, such as robotized, removal tool(s) to separate parts, for example to separate a circuit board from a casing or to expose the circuit board in a casing, and to further remove the components. With an analysis the position of a circuit board in relation to a casing or other parts is determined so that the moving paths of for example a cutting of a robot cell can be programmed in such way that during the disassembly of the casing the circuit board or the components therein are not damaged.

The location and/or dimensions(s) of one or more component(s) installed inside the casing, such as onto a circuit board, can be determined. This information can be used to define a path for an opening tool for opening the casing without damaging the component(s). The method may comprise providing an opening tool for opening the casing. The opening tool may be one or more of the removal tools discussed herein, or other suitable tool, such as mechanical tool, for example a knife, a blade, a saw or the like tool capable of cutting the casing and operatively controlled to the control unit.

The method may comprise determining the location and/or dimensions(s) of one or more component(s) installed inside the casing, such as by imaging the inside of the casing to locate one or more component(s), preferably installed on a circuit board. Also the outside of the casing may be imaged, and both information may be used to determine the location of the component(s), the dimensions of the casing and other suitable information. One or more dimension(s) of the casing may be determined. It is also possible to locate such one or more component(s) if the casing is identified, and if such information can be found from a database of known casings or electronic devices including the casing.

The method may comprise using the determined location and/or dimensions(s) of the one or more component(s) and optionally the dimensions of the casing to control one or more opening means to avoid damaging the components on the circuit board.

In one embodiment of the method the one or more object(s) provided to the device include a casing, and the method further comprises
opening and/or breaking the casing to expose circuit board.

For classification and/or profiling a real-time operating 2D or 3D scanning device may be installed at a conveyor belt or other conveying means for conveying the objects to the system, at a cassette feeding device 33 or equipment, at a robot arm or to two or more of said locations or at other locations disclosed herein.

If circuit boards are standardized, for example standard sized, such as standard E or the like, the boards may be applied to a cassette-based feeding device (cassette feeder) or a another feeding device, which may contain one or more racks, wherein the racks may be stacked, and wherein the edge supports of the racks may be adjusted. For small sized boards one or more automatically adaptable edge support elements may be integrated in a rack, which may enable positioning one or more boards to the same rack. A single board may be fed to or from a cassette feeder by using adjustable height and suitable mechanical structure to apply each stacked rack to a suitable location at the belt and by providing and using a suitable integrated mechanism, such as a pushing pneumatic lever or other means, which can be used to pish or more the board to the belt.

The conveying belt may be based on a modular structure comprising suitable support structure or frames with integrated actuators, such as belt conveyor actuators with a desired length, which may contain suitable integrated edge supports, such as wherein one support is fixed and another support is movable and adjustable according to the profile of the circuit board. Modular conveyors, which may have a length in the range of 500-1000 mm, can be arranged in series so that the edge supports of each module may be individually adjusted according to the conveyed object. which may have different sizes.

Figure 5:
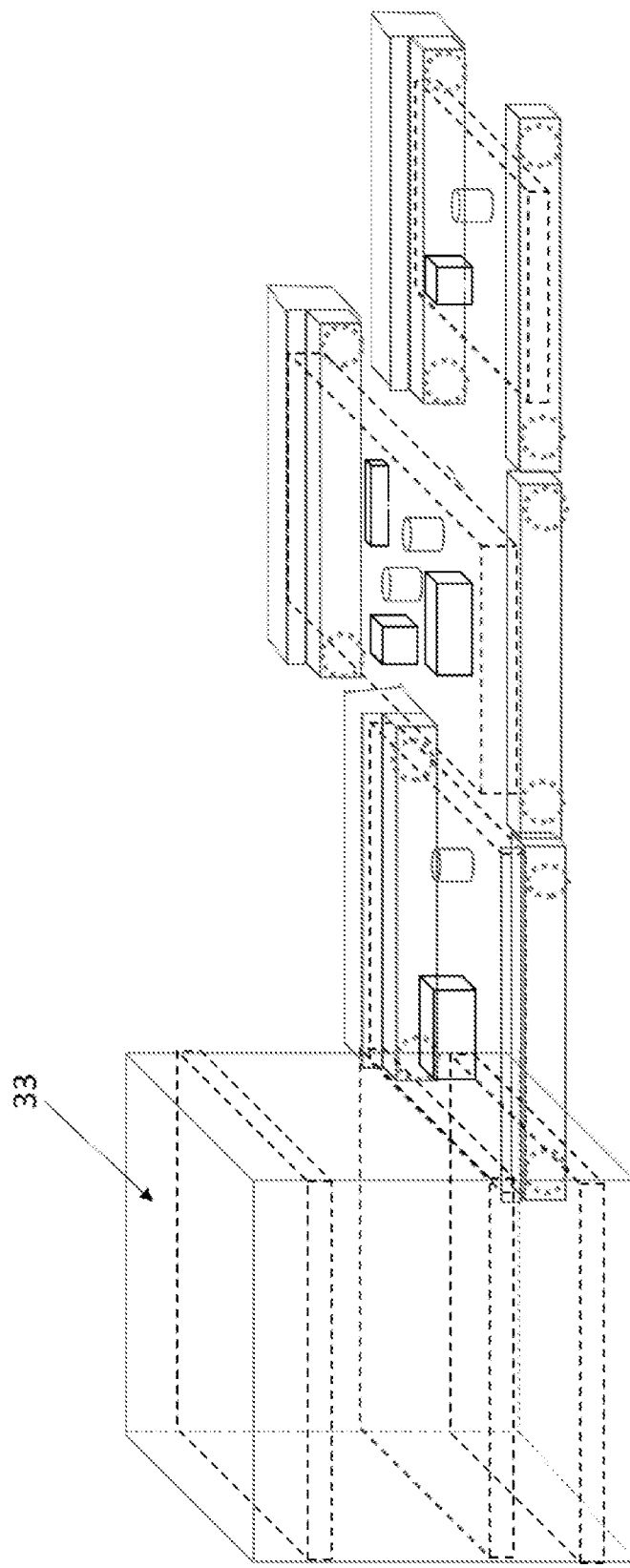
FIG. 5 shows a cassette feeding device, which feeds a modular conveyor belt adaptable for transferring different sized of circuit boards.

In one example three modular conveyors connected in series are provided, as shown in FIG. 5, wherein the middle one may include an integrated removal robot unit (not shown in the figure). A circuit board of certain size is applied or conveyed from a cassette feeder to a first modular conveyor, wherein the edge support adapts according to profiled dimensions of the circuit board. The edge widths of the second and the third modules are set to the same width as in the first one. When the circuit board reaches the middle of the second conveyor module, the conveyor stops and a clamping or holding mechanism is used to hold the board. A robot arm with removal tool is programmed by using information from 3D scanning and from the obtained model which includes e.g. the positions and dimensions of the circuit boards and the components on the board, and by using computing algorithms to move along an optimal route at the board to remove the desired components. The robot arm may contain a picking tool or mechanism, such as a vacuum grabber or mechanical grabber, which may be used to pick the components removed with the removal tool(s), after which the components may be moved into a desired collecting receptacle. During the removal process a next board is fed from the feeding device into the first conveying unit or module, wherein the supper edges are adapted and adjusted according to the dimensions of this board, and which unit remains waiting until the processing of the previous board is finished. When the desired components have been removed, the processed board will move to a next conveying module, and the next board, which was waiting, will be conveyed to processing in similar way as explained in previous. The already processed board is transferred to a receptacle or a container. Again a next board is fed from the cassette feeder to the first conveyor module. This sequence may be repeated until all the boards are processed. The process or parts thereof described in this example may be applied to alternative embodiments and examples described herein, which may utilize alternative devices, tools, means and the like. Any suitable objects containing recoverable components may be processed with the method disclosed in this example and in the alternatives disclosed in this application.

Example 2

Figure 3A:
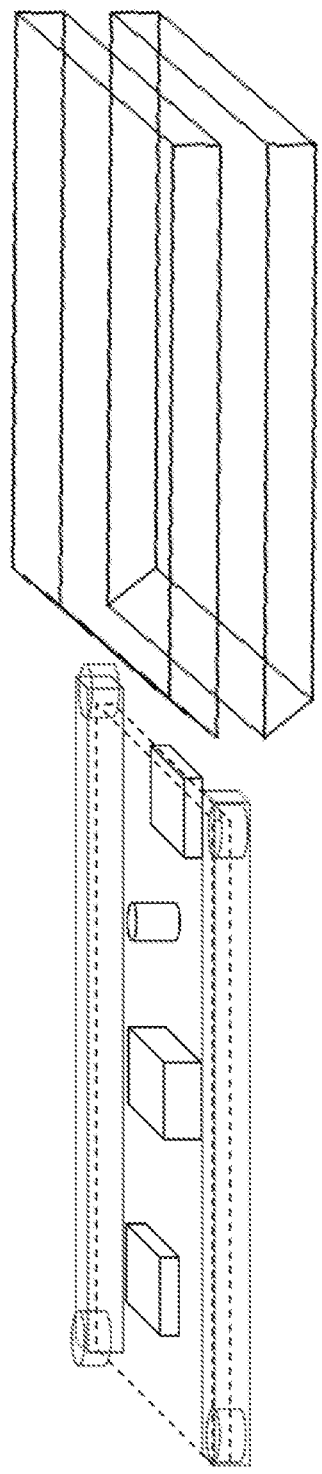
FIG. 3A shows an example of a cutting tool, which can utilize two cutting blades to remove components from both sides of a circuit board.
Figure 3B:
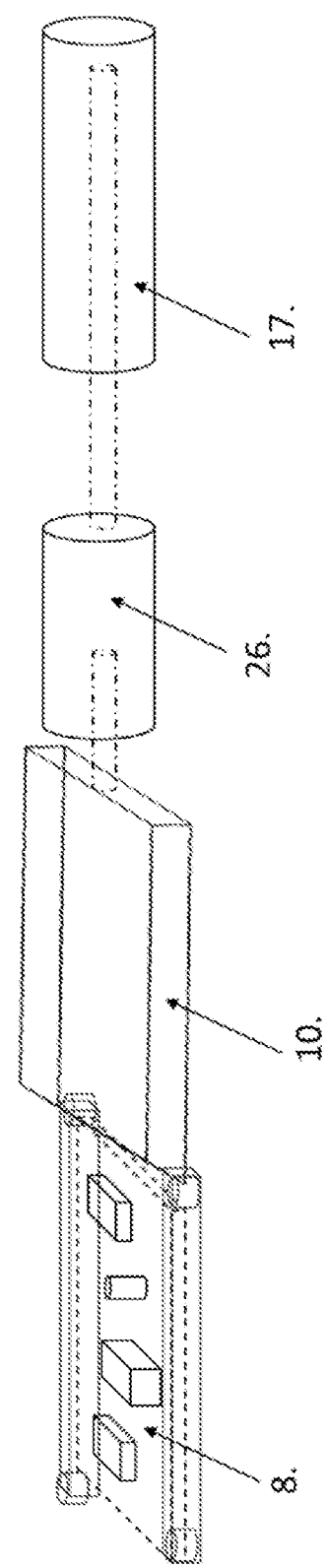
FIG. 3B shows an example of a cutting tool having a pneumatic air hammer integrated to a cutting blade.

As shown in FIGS. 3A and 3B, the components are removed from a circuit board by cutting with a cutting tool moving substantially in the direction of the plane of the board so that the components protruding from the plane of the board will be mechanically cut. The circuit board is pressed from two sides of the board with holding means to stabilize the board.

FIG. 3A shows an example wherein two cutting tools in form of blades are arranged to remove components on the both sides of the circuit board. When the board moves toward the blades and between the blades, which may be stationary, the components are removed by the effect of mechanical force.

FIG. 3B shows an example wherein the setup of FIG. 3A is further supplemented with a pneumatic hammer 26 connected to a pneumatic press 17. The pneumatic hammer (air hammer) is arranged to hit one or more blade(s) 10 to effect the cutting action to remove the components from the circuit board 8. Exemplary cutting means or tolls which may be applied to these examples include guillotine tool, air chipper and ultrasound knife or cutter. A pneumatic tool may be attached to the cutting tool to effect the cutting action. This is advantageous when processing objects such as circuit boards and especially electronic components installed onto the circuit boards. The circuit board preferably should not break during the removal, which could easily happen is too much mechanical force is applied. Therefore it was found to be preferred to provide the removal force as sharp pulses provided by a pneumatic source, wherein the pulses may be precisely directed to the connectors of a component and the component is easily released without causing significant pressure and damage to the circuit board.

Example 3

This example describes a more automated process and system including 1) Analysis, 2) Feeding, 3) Water cutting and 4) Pick and place sorting into separate collecting containers. The system may include a water cutting robot.

A circuit board and the components thereof is analyzed by 2D or 3D scanning, and a profile including dimensions and positioning of the board and components on the board is created. By using this information a model of the circuit board is created. By using the model an optimal routing of means for removing the electronic component(s) from the circuit board is programmed and/or obtained by an automated system. The means for removing the components may comprise one or more robot arm(s), for example 5 to 8 degree of freedom robot arm(s) and/or CNC router. The number of degrees of freedom typically refers to the number of single-axis rotational joints in the arm, where higher number indicates an increased flexibility in positioning a tool. The programming may be carried out to obtain optical routing for the path of the tool(s), and it may be implemented by using a suitable programming language, for example G code language used for controlling CNC routers.

A water cutting tool is attached to a robotized actuator and it may be controlled to obtain desired function(s). For example the cutting speed and/or depth may be adjusted and/or controlled according to the processed material, thickness and desired cutting depth. The cutting groove thickness may be controlled by selecting a suitable diameter and/or profile of a water output nozzle, and an optimal cutting result may be obtained. The speed of the cutting by the water cutting tool is affected by the processed material, the thickness thereof and desired cutting depth. The speed of the water cutting may be adjusted by programming a desired pressure of the water jet, and if necessary, by adding suitable abrasion material to the water, such as fine sand or other inorganic abrasive material. Further, the depth of the cutting may be affected by adjusting the speed of the cutting tool, so that the faster the movement of the cutting tool the less time the water jet can cut and therefore the cutting depth remains low. The water jet may be cut off when necessary, for example when the cutting tool is moved to another location on the circuit board and cutting is not desired during the movement.

A selective removal of components from a circuit board may be implemented for example by directing the water jet to the pins or connectors of a processor, circuit of component, more particularly precisely between the circuit board and the component so that the pins or connectors are cut but the component itself remains intact. For example for the further processing of the components it is advantageous that the metallic pins or connectors can be separated before the components are crushed and pulverized for chemical processing. This decreases chemical consumption and the obtained valuable metals will contain less impurities, such as undesired metals. For example the golden bond wires of integrated circuits can be recovered more efficiently and in more pure form.

A robot arm may include a clamping tool which holds a component during the cutting and/or a suitable grabbing tool to remove the detached component from the board and move in to a collecting container.

By using the principal of selective removal of component a circuit board may be positioned in a water bath on the level of the water surface, or partly or fully under the water. The water mass below the circuit board can suppress the force of the water jet so that the water jet will not damage structures below. Also if the circuit board is immersed in water, especially fully below the surface, the material which is released during cutting remains in the water bath and can be separated for example by filtrating. When water cutting is used the target is not exposed to high temperatures so no harmful substances caused by heat are released to the air or environment.

Figure 4:
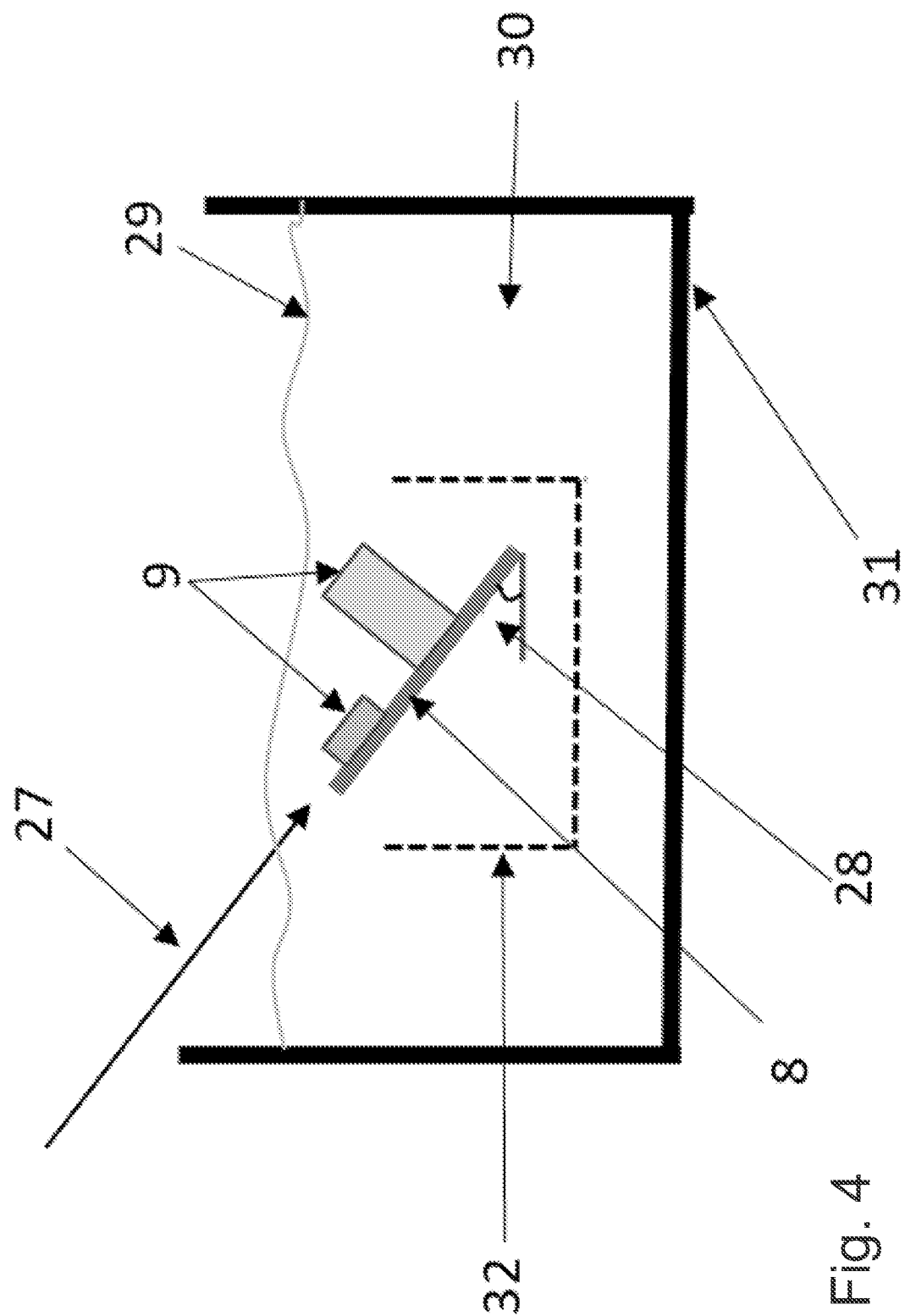
FIG. 4 shows an example utilizing water jet for removing the components from a circuit board.

The previous examples can be used for selectively removing one or more desired component(s) from a circuit board. Alternatively all the components on the circuit board can be removed by using water cutting tool, especially if there is no need to select only certain components for removal and recovery. In such case, as presented in FIG. 4, the circuit board 8 may be placed in a suitable angle 28 in respect of the proceeding angle of the water jet 27 and in respect of the liquid 30 in the water container 31 so that the cutting water jet is directed between the circuit board and the attachment location of the components 9 or in such way that the cutting is directed partly to the circuit board to minimize the undesired abrasion of the components caused by the width of the cutting area. A robot arm or a CNC router connected to water cutting tool may be directed to move along the plane of the board with a suitable speed in such way that when the cutting water jet has passed through the whole width of a circuit board at a width of a cutting jet, it will be moved forward and moved towards to the other edge in the direction of the width of the board. The passing of a single jet can be detected and/or analyzed for example by detecting the proceeding of the jet by using optical methods and devices, such as ones based on machine vision. In another cutting principle the cutting water jet is moved back and forth by the width of the plane until all the components have been release. The release of the components can be detected and/or analyzed by using optical methods and devices, such as ones based on machine vision.

Example 4

This example presents an automated process and setup comprising one or more robot arms having 5-8 degrees of freedom. The process and system include 1) Analysis, 2) Feeding, 3) Air hammer/chipper removal, and 4) Pick and place sorting into separate collecting containers. The system may include a 3D scanner, a machine vison camera, a grabbing mechanism and alternative removal tools, such as air hammer or air chipper with an integrated knife, laser cutting tools etc.

The circuit boards may be present as unsorted in open collection boxes or containers. The system may recognize a single circuit board by using machine vison, picks it with grabbing means, and places the board onto a platform on a working area for profiling. The system measures the dimensions of the board for profiling, and a clamping mechanism on the working area is adjusted to adapt according to the profile, especially according to the dimensions. By using pattern recognition algorithms, optical character recognizing algorithms, and/or other computing algorithms the system classifies the components on the board into component types. An optimal cutting and/or removal route, cutting angles and cutting speed(s) for the cutting tools are calculated and defined. The robot arm(s) and any further movable means and tools are controlled according to the defined routes, angles, speeds and other information. The removal of the components can be then carried out wherein each single component is held with an integrated holding mechanism of a robot arm, removed from the board with a removal tool, and picked and moved into a collecting container. Alternatively two different robot arms may be used wherein the first arm carries out a visual analysis of a component, holding the component, pick and place function, and the other arm carries out the removal of the component by using a removal tool. When all the components have been removed from the circuit board a robot arm moves the processed board into a designated container.

Example 5

The principles of Example 3 or 4 may be applied but instead of water jet or air hammer/clipper cutting tools diamond wire loop may be used as a cutting tool. A diamond wire loop can be used in a diamond wire saw, which enables providing a flexible cutting tool which can be used for straight line cutting but also to for curved surface cutting.

Example 6

The circuit board may be provided as installed in a casing, cover or the like, or the circuit board may include the casing, cover or the like. The system may recognize optically, such as by using machine vision as discussed herein, the dimensions, colour or other characteristic features of the casing, cover or other external part integrated with the circuit board or provided with the circuit board.

In one example the system recognizes a brand name and/or model name, code or other type printed in the circuit board and/or the casing or cover. This information can be then used to search databases for information about the circuit board, the components contained in the board, the dimensions, location and/or other information about the components. This information is fetched from a database and used for creating a model about the circuit board currently under treatment.

Example 7

This example describes IC chips removal and additional pre/post processing by using e.g. FiberLaser based IC decapsulation method with optional plasma, such as Atmospheric Plasma Assistance, to avoid corrosion, cooler blast and cold table to reduce impact of temperature elevation of the die, mechanical chemical or reverse electroplated (electrolysis) based recovery of exposed bond wires (such as ones including Au, Ag, Cu, Pt etc).

Conventional way to extract gold from IC bonding wires is to first crush and grind the IC chips in to powder and then use chemical leaching method. In this case pulverizing causes hazardous dust and some gold is lost during the grinding process. In the present method part of the IC capping is removed to expose bonding wires to enable efficient recovery.

Electronic circuit boards are modelled and all the individual IC chip's 3D profiles & positions are identified by using 3D laser scanning method. Optionally colour digital camera imaging, feature extraction and image analysis algorithms may be used to identify IC type designation and additional information from database/cloud/server etc. about IC related capping layer thickness, surface area to be decapsulated, optimal laser power to be used and robot arm or CNC machine guided laser tool xyz movement information for positioning and speed elevation.

IC decapsulation can be done after modelling of populated PCB boards while IC chips are still in place or as post processing after IC removal completion. After IC chips are decapsulated then the exposed valuable gold bond wires are recovered by using for example mechanical methods such as grinding tools, chemical leaching tools or reverse electroplating (electrolysis), ECM or inverse jet ECM methods.

In case of using reverse electroplating/electrolysis method to recover valuable metals all the IC pins are first short circuited and connected to anode voltage. Short circuiting of IC pins is carried out for example by using stainless steel clamping mechanism that forms the anode structure and enables electrical current to flow between electrolysis power supply's positive pole and gold bond wires. Negative pole of the power supply is then connected to cathode plate placed in electrolyte chemical solution container. Short circuited IC chips are dipped in chemical electrolyte solution and to a voltage between 1-3 VDC to recover the gold wires deposited in cathode plate.

Example 8

Recyclable electronic devices are provided in a non-disassembled form, i.e. as a whole including a casing. The recyclable devices are fed to a conveyor belt of the disassembling system. The system images the casings by using means which can penetrate through the casing, and creates a model of each casing including a geometry, dimensions and locations of circuit boards, components, batteries and other parts inside the casings. Also the outer dimensions of the casings are imaged, the casing material is recognized and models are created. With the models the system selects a suitable opening tool and determines suitable moving path for the tool so that the components inside the casings are not damaged in the opening process. If necessary the casing is turned in such way that the recoverable components point upwards. The system uses the opening tool, such as laser cutting tool or angle grinder, to open the upper part of the casing so that the circuit board in the casing is exposed.

The circuit board is imaged and a new model is created to recognize and identify components on the circuit board. The system decides which components to remove and recover, and selects suitable removal tools for this. The system also calculates optimal moving path for each removal tool, such as positioning, approach angle, speed, specific parameters for the removal tool and the like for each component to be removed.

The system is provided with several robot cells to carry out the method steps, such as two or more robot cells with specific removal and/or picking/recovery tools integrated in each one.

The components are removed, picked up and moved into corresponding containers according to their classification. A circuit board substantially without components is obtained together with remains of the casing, which parts may be directed to suitable further processing and recycling.

Example 9

The removed components, such as integrated circuits and processors, may be recovered and collected and processed together in a further step.

In one example integrated circuits (IC) are treated to remove the coating on top of them and to expose the bond wires inside the circuit. The valuable metals contained in the wires are recovered into a cathode plate, which is connected to a negative pole of a voltage source, according to reverse electroplating principle. In this arrangement all the pins of the IC are short-circuited by using a conductive anode structure, and positive pole of the voltage source is connected to the anode structure. The short-circuiting is facilitated by using the model to locate the corresponding pins, to form a pattern including the pins, and directing a suitable conductive tool acting as the anode structure to cover all the pins. A robot arm dips the short-circuited IC's to an electrolyte solution. The short-circuiting mechanism may be automatically adaptable, and it may be integrated as a part of a robot cell or it may be a separate functional entity. By using a suitable voltage, such as 0.1-4.0 VDC, current density and electrolyte solution the gold material from the short-circuited gold-plated pins and golden bond wires can be recovered onto the cathode plate, from where it can be further recovered mechanically.

In some circuits the pins are located at the bottom and in some other ones they are at the sides. In general the components may be classified according to size and the location of the pins or other connectors. In such case it is possible to provide a suitable support and mechanism for receiving a plurality of circuits, for example parallel and/or stacked, and place the conductive parts in contact with a suitable anode structure. The anode structure may comprise for example metal mesh, which may be placed on a support comprising elastic material to adapt the surface into different targets, or it may comprise porous conductive material or membrane structures. Clamping or other pressing means or mechanisms may be used to contact all the pins.

The invention claimed is:

1. A device for disassembling electronics, the device comprising:
    transporting means, or holding means arranged to receive one or more objects comprising a circuit board containing one or more electronic components, the holding means being adjustable,
    imaging means for imaging the one or more objects;
    one or more removal means for removing the one or more electronic components from the circuit board,
    one or more recovery means for recovering the removed one or more electronic components,
    each of the transporting, imaging, one or more removal, and one or more recovery means being operatively connected to a control unit, wherein the device is arranged
    to create a 3D model of the one or more objects based on the information, obtained from the imaging means,
    to locate the one or more electronic components from the 3D model,
    to adjust the holding means to adapt to the one or more objects and hold the one or more objects,
    by using the 3D model to control the one or more removal means to remove the one or more electronic components from the circuit board by:
        first removing a certain type of the one or more electronic components,
        recovering the removed certain type of the one or more electronic components by using the one or more recovery means, wherein the one or more recovery means are configured to use vacuum or pressurized air, or by using the one or more holding means to adjust an angle of the circuit board to move the removed certain type of the one or more electronic components by gravity into collecting means provided below the one or more objects,
        conveying the removed certain type of the recovered one or more electronic components to a desired location, and
        then continuing with removing a different type of the one or more electronic components.

2. The device of claim 1, wherein the imaging means is selected from one or more imaging device(s) comprising a passive scanner utilizing light, radiation, sound or energy of the environment and from one or more imaging device(s) comprising an active scanner selected from active light scanner comprising one or more source(s) of light t, radiating device(s) comprising one or more source(s) of radiation and one or more detector(s) of radiation or acoustic device(s) comprising one or more source(s) of sound and one or more detector(s) of sound.

3. The device of claim 1, wherein the holding means comprises one or more adjustable grabbing means or one or more adjustable element arranged to move in perpendicular direction to the transport direction of the circuit board.

4. The device of claim 1, wherein the one or more removal means comprises one or more tools selected from a water cutting tool, a die, a knife, a guillotine cutter, a milling tool, an ultrasound cutting tool, a laser cutting tool, a plasma cutting tool, a soldering device, an infra-red heater, a heating element, for a limited area in range of 0.2-10 cm, a pressing tool, a clamp tool, a grinding wheel, a disk saw, a diamond wire cutting tool, or a combination of two or more thereof.

5. The device of claim 1, wherein the one or more removal means comprises one or more electrochemical removal tool(s) selected from ECM, Jet-ECM and inverse Jet ECM.

6. The device of claim 1, wherein the transporting means, the holding means, the one or more removal means or the one or more recovery means comprises one or more robot arm(s).

7. The device of claim 1, wherein the transporting means or the holding means are arranged to be adaptable to the received object.

8. The device of claim 1, comprising one or more means for removing filler or coating covering a metal to be recovered in the electronic component to expose the metal.

9. The device of claim 1, containing or connected to one or more databases comprising information of components, circuit boards and devices which are or have been commercially available to enhance, speed up or enable recognition, classification or separation of the components, circuit board or devices currently in the system.

10. The device of claim 1, wherein the one or more recovery means comprises vacuum means connected to a tube for delivering the recovered component to a desired location through the tube.

11. The device of claim 1, wherein the one or more recovery means comprises a source of pressurized air and a nozzle for moving the removed component(s) from the one or more objects by using the air pressure to a desired direction or location.

12. A method for disassembling electronics, the method comprising providing the device of any of claim 1;
 providing one or more object(s) comprising circuit board(s) containing one or more electronic component(s), to the device;
 imaging the object to obtain one or more digital image(s) of the object;
 creating a 3D model of the object based on the information obtained from the imaging;
 locating one or more electronic component(s) from the model;
 adjusting the holding means to adapt the holding means to the object and to hold it;
 by using the model controlling the one or more removal means to remove one or more electronic component(s) from the circuit board; and
 recovering the removed electronic component(s).

13. The method of claim 12, comprising recognizing one or more electronic component(s) from the model to be removed and recovered, and removing and recovering said electronic components.

14. The method of claim 13, wherein the recognizing comprises identifying the object, a circuit board or an electronic component.

15. The method of claim 12, wherein the creating the model of the object comprises creating a 2D or a 3D model of the object including at least one of the width, length and height of the object, and also one or more of profile, edge, groove, bead, gap, angle, roundness, presence, flatness, deformation, flushness, spectral analysis and classification of materials, including location of one or more electronic component(s) in the object.

16. The method of claim 15, wherein the identifying the object, a circuit board or an electronic component comprises detecting one or more pattern(s) or character(s) on the object, and by comparing this information to a database of known objects comprising information of a plurality of types or models of circuit boards, casings or electronic components, recognizing matching information and obtaining the model of the object, the circuit board or the electronic component to identify the object, the circuit board or the electronic component.

17. The method of claim 12, comprising selecting a suitable removal means for each electronic component from two or more removal means, and removing the electronic component by using the selected removal means.

18. The method of claim 12, comprising calculating a path for one or more tool(s), such as the removal means, holding means and a grabbing tool by using he model, wherein the calculating includes defining, creating, optimizing or controlling one or more path(s) for one or more tool(s).

19. The method of claim 12, comprising removing filler or coating covering a metal to be recovered in the electronic component to expose the metal, and recovering the metal.

20. The method of claim 12, comprising
 recognizing, removing or recovering one or more metal(s) present in the electronic component(s) or metal(s) present as a coating in the object by using an electrochemical removal means.

21. The method of claim 12, wherein the one or more object(s) provided to the device include a casing, and the method comprises
 determining the location or dimensions(s) of one or more electronic component(s) installed inside the casing, such as by imaging the inside of the casing to locate one or more electronic component(s), or determining one or more dimension(s) of the casing;
 opening or breaking the casing to expose circuit board, optionally by using the determined location or dimensions(s) of the one or more electronic component(s) or the one or more dimension(s) of the casing to control one or more opening means to avoid damaging the electronic component(s) on the circuit board.

22. The method of claim 12, comprising first removing all components of certain type or category, recovering them all by using the recovery means to convey the components to a desired location, and then continuing with removal of different type or class of components.

23. The method of claim 12, comprising measuring the object to obtain one or more dimension(s) of the object, and creating a 3D model of the object based on the information obtained from the measuring.

24. The device of claim 1, comprising measuring means for measuring the object, wherein the device is arranged to create a 3D model of the object further based on the information obtained from the measuring means.

25. The device of claim 1, wherein the wherein the device is arranged to recognize one or more electronic component(s) from the model.

26. The device of claim 1, comprising one or more recovery means for recovering removed electronic component(s), the means being operatively connected to a control unit, wherein the device is arranged to recover the removed electronic component(s) by using the recovery means.

27. The device of claim 26, wherein the recovering comprises recovering by using vacuum or pressurized air.

* * * * *